(12) United States Patent
Iwata et al.

(10) Patent No.: US 10,879,410 B2
(45) Date of Patent: Dec. 29, 2020

(54) SOLAR CELL MODULE

(71) Applicant: PANASONIC INTELLECTUAL PROPERTY MANAGEMENT CO., LTD., Osaka (JP)

(72) Inventors: Masahiro Iwata, Osaka (JP); Tasuku Ishiguro, Osaka (JP); Haruhisa Hashimoto, Osaka (JP); Youhei Murakami, Osaka (JP); Akimichi Maekawa, Osaka (JP); Shingo Okamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/710,644

(22) Filed: Sep. 20, 2017

(65) Prior Publication Data

US 2018/0013025 A1    Jan. 11, 2018

Related U.S. Application Data

(63) Continuation of application No. PCT/JP2016/000753, filed on Feb. 15, 2016.

(30) Foreign Application Priority Data

Mar. 30, 2015  (JP) .................................. 2015-070292

(51) Int. Cl.
*H01L 31/054* (2014.01)
*H01L 31/048* (2014.01)
(Continued)

(52) U.S. Cl.
CPC .. *H01L 31/0481* (2013.01); *H01L 31/022425* (2013.01); *H01L 31/05* (2013.01);
(Continued)

(58) Field of Classification Search
CPC ..... H01L 31/00; H01L 31/02; H01L 31/0232; H01L 31/02327; H01L 31/048; H01L 31/054; H01L 31/0547; H01L 31/056
See application file for complete search history.

(56) References Cited

U.S. PATENT DOCUMENTS 5,994,641 A    11/1999  Kardauskas
2006/0107991 A1*  5/2006  Baba ................... H01L 31/0547
                                                    136/244

(Continued)

FOREIGN PATENT DOCUMENTS

JP    2002-513210 A    5/2002
JP    2012-079772 A    4/2012
(Continued)

OTHER PUBLICATIONS

Refractive index of EVA from PV Lighthouse, retrieved on Mar. 22, 2018 from https://www2.pvlighthouse.com.au/resources/photovoltaic%20materials/refractive%20index/refractive%20index.aspx.*

(Continued)

*Primary Examiner* — Christina Chern
(74) *Attorney, Agent, or Firm* — McDermott Will & Emery LLP

(57) ABSTRACT

A solar cell module includes: a solar cell; a conductive light-reflective film disposed on a back surface side of the solar cell, the conductive light-reflective film extending from an edge portion of the solar cell; an insulating member disposed between a back surface of the solar cell and the conductive light-reflective film; and a back-surface side encapsulant covering the solar cell and the conductive light-reflective film from the back surface side of the solar cell, wherein the insulating member is made of a material harder than a material of the back-surface side encapsulant.

13 Claims, 22 Drawing Sheets

(51) Int. Cl.
*H01L 31/056* (2014.01)
*H01L 31/0224* (2006.01)
*H01L 31/05* (2014.01)
*H01L 31/18* (2006.01)

(52) U.S. Cl.
CPC ........ *H01L 31/056* (2014.12); *H01L 31/0547* (2014.12); *H01L 31/18* (2013.01); *Y02E 10/52* (2013.01)

(56) References Cited

U.S. PATENT DOCUMENTS

| | | | |
|---|---|---|---|
| 2009/0178704 A1* | 7/2009 | Kalejs | B32B 17/10743 136/246 |
| 2010/0059103 A1* | 3/2010 | Ahn | H01L 31/048 136/246 |
| 2010/0147363 A1* | 6/2010 | Huang | B32B 17/10009 136/251 |
| 2010/0243033 A1* | 9/2010 | Brouwer | H01L 31/048 136/246 |
| 2010/0263716 A1* | 10/2010 | Kitao | H01L 31/056 136/252 |
| 2011/0279918 A1* | 11/2011 | Almogy | H01L 31/0521 359/872 |
| 2011/0297207 A1 | 12/2011 | Ishihara et al. | |
| 2013/0298965 A1* | 11/2013 | Liu | H01L 31/0527 136/246 |
| 2013/0340804 A1* | 12/2013 | Moon | H01L 31/0516 136/244 |
| 2014/0102515 A1 | 4/2014 | Sakuma et al. | |
| 2015/0059831 A1 | 3/2015 | Fukumochi et al. | |
| 2015/0083185 A1 | 3/2015 | Kawakami et al. | |

FOREIGN PATENT DOCUMENTS

| | | |
|---|---|---|
| JP | 2012-204596 A | 10/2012 |
| JP | 2013-098496 A | 5/2013 |
| JP | 2014-179462 A | 9/2014 |
| JP | 2014-183289 A | 9/2014 |
| JP | 2014-192395 A | 10/2014 |
| JP | 2014-207305 A | 10/2014 |
| WO | 2010/092693 A1 | 8/2010 |
| WO | 2012/176516 A1 | 12/2012 |
| WO | 2013/140623 A1 | 9/2013 |

OTHER PUBLICATIONS

Refractive index of glass from PV Lighthouse, retrieved on Mar. 22, 2018 from https://www2.pvlighthouse.com.au/resources/photovoltaic%20materials/refractive%20index/refractive%20index.aspx.*

Refractive index of PET from Polymer Properties Database, retrieved on Mar. 22, 2018 from http://polymerdatabase.com/polymer%20physics/Ref%20Index%20Table2%20.html.*

Material Properties of PET vs. PVF, retrieved on Mar. 22, 2018 from https://www.makeitfrom.com/compare/Polyethylene-Terephthalate-PET-PETE/Polyvinyl-Fluoride-PVF.*

"Glass Transition Temperature for Epoxies" retrieved from http://www.epotek.com/site/files/Techtips/pdfs/tip23.pdf on Oct. 26, 2018.*

"EVA product information" for Polysciences, Inc. retrieved from http://www.polysciences.com/default/catalog-products/monomers-polynners/polynners/poly-eva-poly-evoh/ethylene-vinyl-acetate/ on Oct. 26, 2018.*

Refraction—The Physics Hypertextbook retrieved from https://physics.info/refraction/ on Jun. 17, 2019.*

PET vs EVA retrieved from https://www.makeitfrom.com/compare/Polyethylene-Terephthalate-PET-PETE/Ethylene-Vinyl-Acetate-EVA on Jun. 17, 2019.*

PET vs PMMA retrieved from https://www.makeitfrom.com/compare/Polyethylene-Terephthalate-PET-PETE/Polymethylmethacrylate-PMMA-Acrylic on Jun. 17, 2019.*

Acrylic vs. EVA retrieved from https://www.makeitfrom.com/compare/Polymethylmethacrylate-PMMA-Acrylic/Ethylene-Vinyl-Acetate-EVA on Jun. 17, 2019.*

Overview of materials for EVA retrieved from http://www.matweb.com/search/datasheet_print.aspx?matguid=f34f846b98f1466780dfb3c0e5c0ca82&n=1 on Jun. 18, 2019.*

PC vs. EVA retrieved from https://www.makeitfrom.com/compare/Polycarbonate-PC/Ethylene-Vinyl-Acetate-EVA on Jun. 12, 2020.*

International Search Report and Written Opinion issued in International Patent Application No. PCT/JP2016/000753, dated May 10, 2016; with partial English translation.

Extended Search Report issued in European Patent Application No. 16771581.2, dated Mar. 9, 2018.

* cited by examiner

SOLAR CELL MODULE

CROSS REFERENCE TO RELATED APPLICATIONS

This application is a U.S. continuation application of PCT International Patent Application Number PCT/JP2016/000753 filed on Feb. 15, 2016, claiming the benefit of priority of Japanese Patent Application Number 2015-070292 filed on Mar. 30, 2015, the entire contents of which are hereby incorporated by reference.

BACKGROUND

1. Technical Field

The present disclosure relates to a solar cell module.

2. Description of the Related Art

In recent years, solar cell modules have been progressively developed as photoelectric conversion devices which convert light energy into electric energy. Solar cell modules can directly convert inexhaustible sunlight into electricity, and thus have less environmental impact and generate power more cleanly than power generation using fossil fuels. Accordingly, such solar cell modules are expected to provide new energy sources.

For example, a solar cell module has a structure in which solar cells are sealed by an encapsulant, between a front surface protecting member and a back surface protecting member. In the solar cell module, the solar cells are disposed in a matrix.

Conventionally, a solar cell module has been proposed in which in order to effectively use sunlight emitted on the space between solar cells, a light reflector projecting out from the light-receiving surfaces of the solar cells and inclined relative to the light-receiving surfaces is provided in the space between the solar cells (for example, Japanese Unexamined Patent Application Publication No. 2013-98496).

SUMMARY

When a light reflector which includes a conductive light-reflective film such as a metal film is stacked on an edge portion of a solar cell, an issue arises that is to maintain the insulation between the solar cell and the conductive light-reflective film.

The present disclosure provides a solar cell module which can maintain the insulation between a solar cell and a conductive light-reflective film.

In order to achieve the above object, a solar cell module according to an aspect of the present disclosure includes: a first solar cell; a conductive light-reflective film disposed on a back surface side of the first solar cell, the conductive light-reflective film extending from an edge portion of the first solar cell; an insulating member disposed between a back surface of the first solar cell and the conductive light-reflective film; and a back-surface side encapsulant covering the first solar cell and the conductive light-reflective film from the back surface side of the first solar cell, wherein the insulating member is made of a material harder than a material of the back-surface side encapsulant.

The insulation between a solar cell and a conductive light-reflective film can be maintained.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes embodiments of the present disclosure with reference to the drawings. The embodiments described below each illustrate a particular example of the present disclosure. Thus, the numerical values, shapes, materials, elements, the arrangement and connection of the elements, processes, the order in which the processes are performed, and others indicated in the following embodiments are mere examples, and are not intended to limit the present disclosure. Therefore, among the elements in the following embodiments, elements not recited in any of the independent claims defining the most generic concept of the present disclosure are described as arbitrary elements.

The drawings are schematic diagrams and do not necessarily give strict illustration. Throughout the drawings, the same sign is given to the same element, and redundant description is omitted or simplified.

Embodiment 1

[Configuration of Solar Cell Module]

Figure 1A:
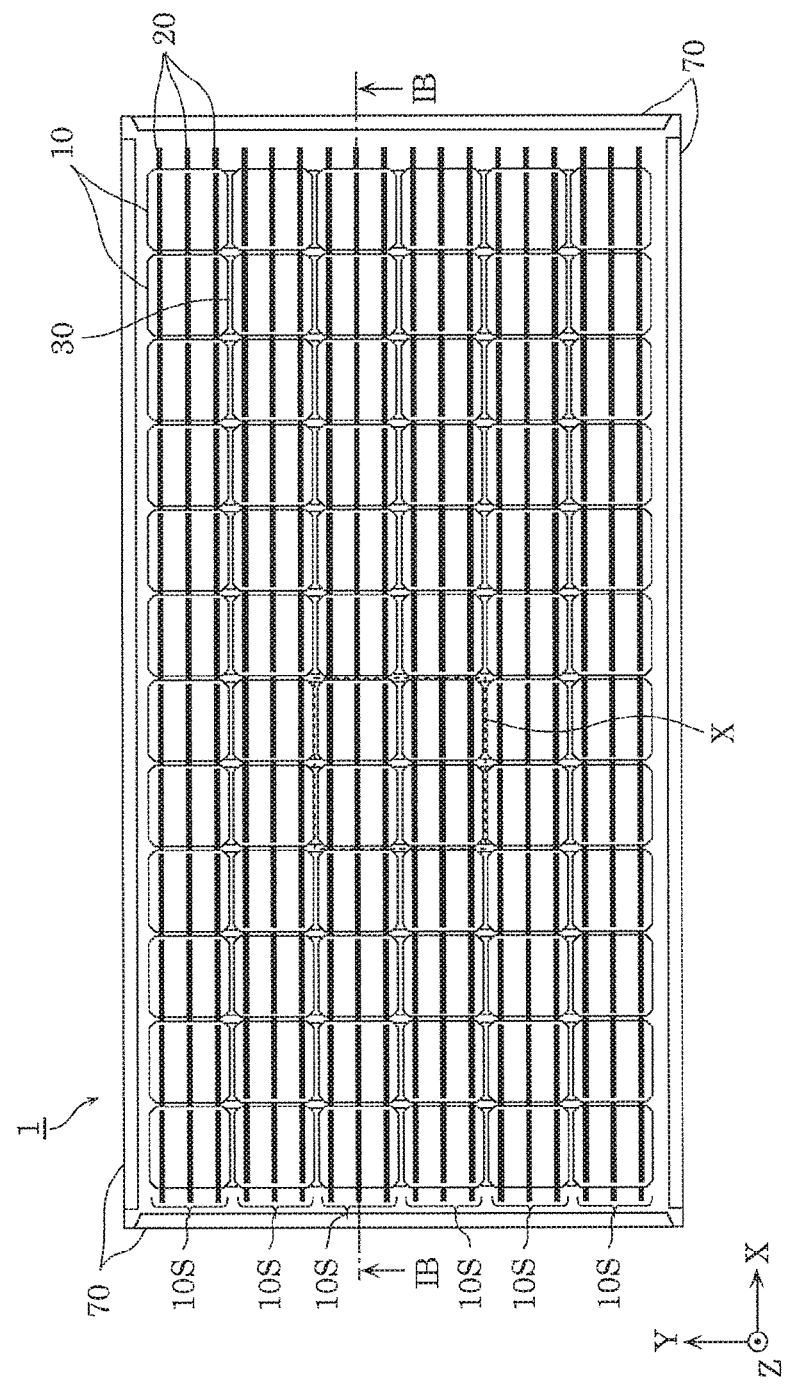
FIG. 1A is a plan view of a solar cell module according to Embodiment 1.
Figure 1B:
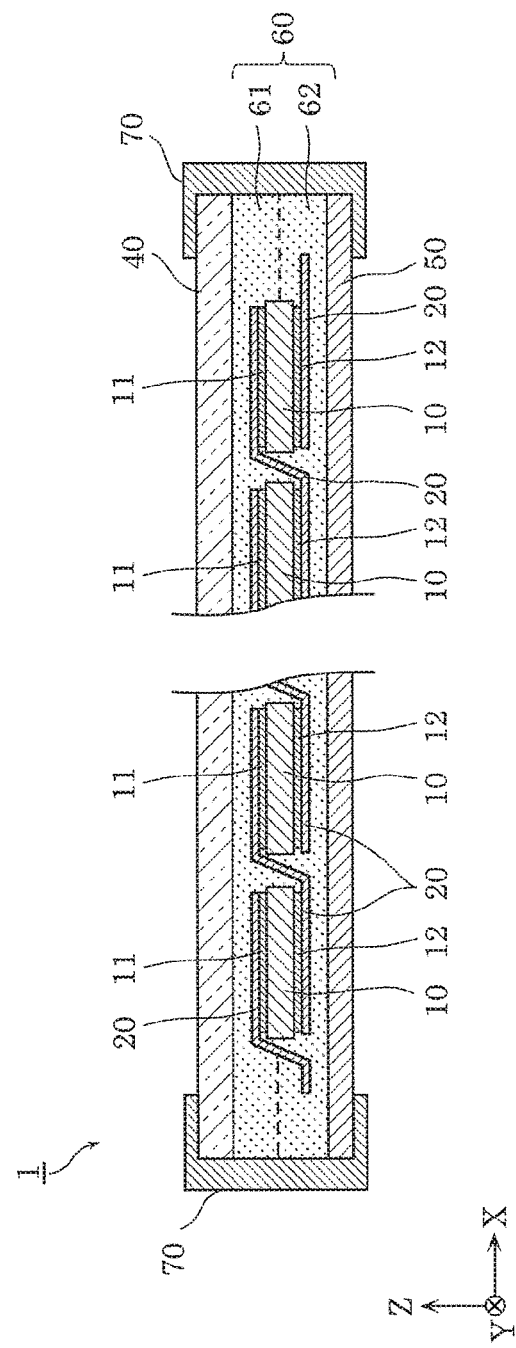
FIG. 1B is a cross-sectional view of the solar cell module according to Embodiment 1 taken along line IB-IB in FIG. 1A.

The first describes a schematic configuration of solar cell module 1 according to Embodiment 1, with reference to FIGS. 1A and 1B. FIG. 1A is a plan view of the solar cell module according to Embodiment 1. FIG. 1B is a cross-sectional view of the solar cell module according to Embodiment 1 taken along line IB-IB in FIG. 1A.

Note that in FIGS. 1A and 1B, the Z axis is perpendicular to the principal surface of solar cell module 1, and the X axis and the Y axis are orthogonal to each other and are both orthogonal to the Z axis. The same applies to the Z axis, the X axis, and the Y axis in the drawings described below.

As illustrated in FIGS. 1A and 1B, solar cell module 1 includes solar cells 10, tab lines 20, light reflectors 30, front surface protecting member 40, back surface protecting member 50, encapsulant 60, and frame 70. Solar cell module 1 has a structure in which solar cells 10 are sealed by encapsulant 60 between front surface protecting member 40 and back surface protecting member 50.

As illustrated in FIG. 1A, the shape of solar cell module 1 in a plan view is substantially quadrilateral, for example. As an example, solar cell module 1 has a substantially quadrilateral shape having a width of about 1600 mm, and a length of about 800 mm. Note that the shape of solar cell module 1 is not limited to a quadrilateral.

Figure 2:
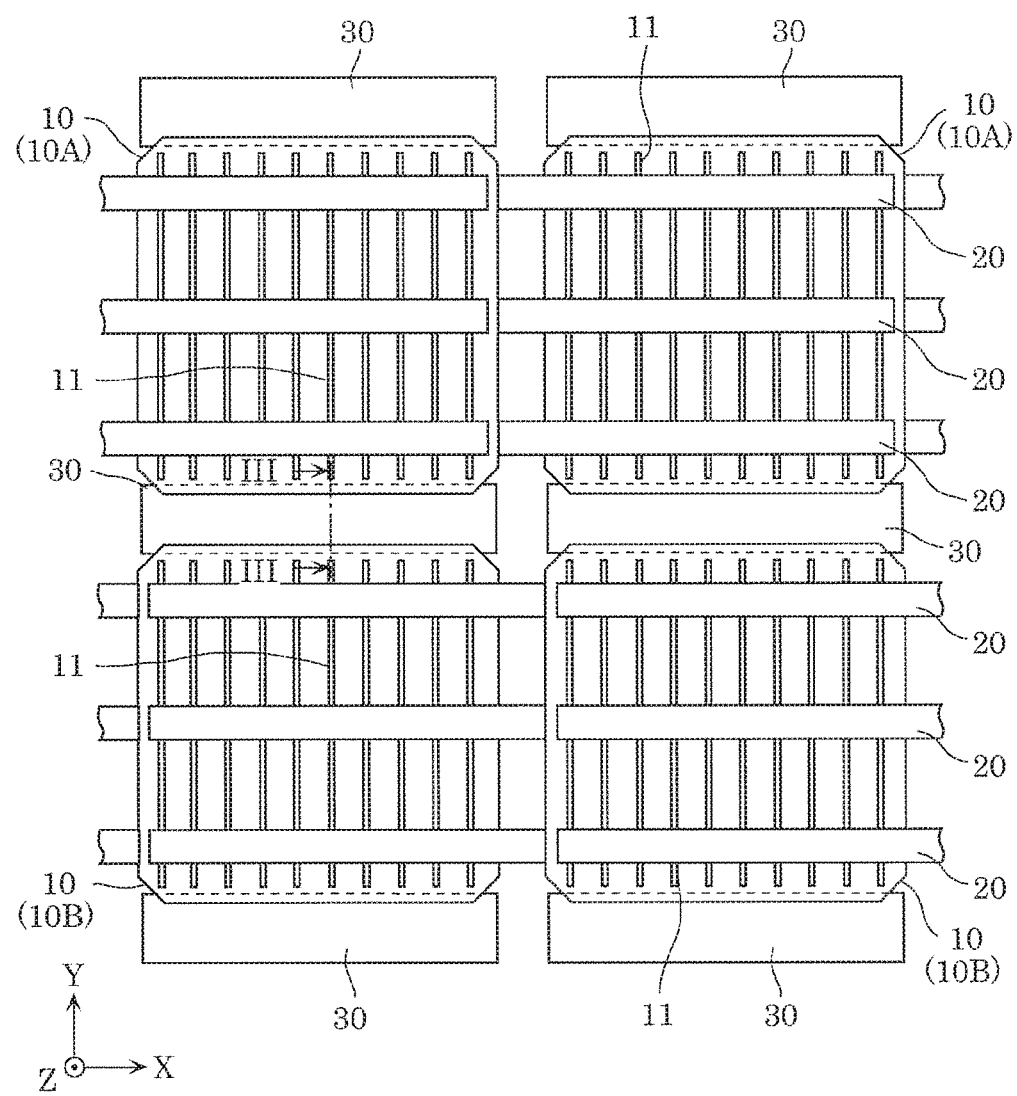
FIG. 2 is an enlarged plan view when the solar cell module according to Embodiment 1 is viewed from the front surface side.
Figure 3:
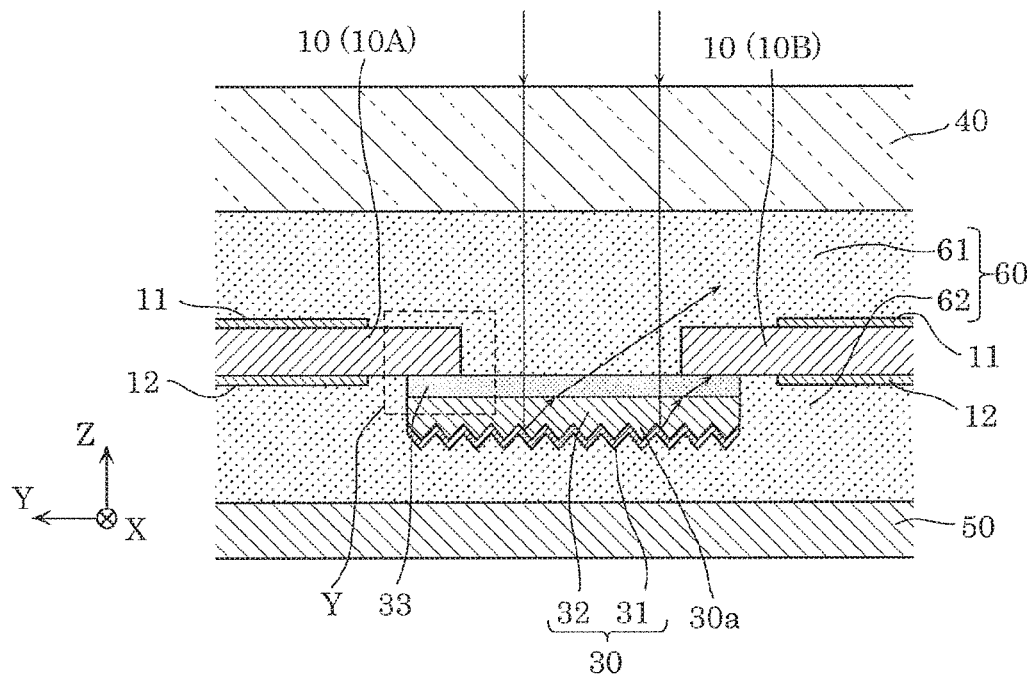
FIG. 3 is a cross-sectional view (enlarged cross-sectional view around a light reflector) of the solar cell module according to Embodiment 1 taken along line III-III in FIG. 2.

The following describes in further detail components of solar cell module 1, with reference to FIGS. 1A and 1B, and also FIGS. 2 and 3. FIG. 2 is an enlarged view of region X surrounded by the dashed line in FIG. 1A, and is an enlarged plan view when the solar cell module according to Embodiment 1 is viewed from the front surface side. FIG. 2 illustrates a state where the solar cell module is viewed from the main light-receiving surface side (front surface protecting member 40 side). FIG. 3 is a cross-sectional view of the solar cell module according to Embodiment 1 taken along line III-III in FIG. 2. Note that FIG. 3 is an enlarged cross-sectional view around light reflector 30.

[Solar Cell (Photovoltaic Cell)]

Solar cell 10 is a photoelectric conversion element (photovoltaic element) which converts light such as sunlight into power. As illustrated in FIG. 1A, solar cells 10 are disposed in rows and columns (a matrix) in the same plane.

Pairs of adjacent solar cells 10 among solar cells 10 linearly aligned are connected by tab lines to form a string (cell string). Solar cells 10 are formed into a string by being electrically connected by tab lines 20. Solar cells 10 in one string 10S are connected in series by tab lines 20.

As illustrated in FIG. 1A, in the present embodiment, 12 solar cells 10 disposed at equal intervals in the row direction (the X axis direction) are connected by tab lines 20 to form one string 10S. More specifically, each string 10S is constituted by sequentially connecting pairs of solar cells 10 adjacent in the row direction (the X axis direction) using three tab lines 20 for each pair, so that all solar cells 10 in a line aligned in the row direction are connected.

A plurality of strings 10S are formed. Strings 10S are disposed in the column direction (the Y axis direction). As illustrated in FIG. 1A, six strings 10S are disposed at equal intervals along the column direction, parallel to one another.

Note that leading solar cell 10 in each string 10S is connected to a connecting line (not illustrated) via tab lines 20. Furthermore, solar cell 10 at the tail end in each string 10S is connected to a connecting line (not illustrated) via tab lines 20. Accordingly, a plurality of strings 10S (six strings 10S in FIG. 1A) are connected in series or parallel to one another to constitute a cell array. In the present embodiment, two adjacent strings 10S are connected in series to constitute a series connection (a series connection of 24 solar cells 10), and three such series connections are connected in parallel.

As illustrated in FIGS. 1A and 2, solar cells 10 are disposed such that solar cells adjacent in the row direction and the column direction have a space therebetween. As described below, light reflectors 30 are disposed in such spaces.

In the present embodiment, solar cell 10 has a substantially quadrilateral shape in a plan view. Specifically, solar cell 10 is a 125-mm square having chamfered corners. Thus, one string 10S is constituted such that sides of two adjacent solar cells 10 are facing each other. Note that the shape of solar cell 10 is not limited to a substantially quadrilateral shape.

The basic structure of solar cell 10 is a semiconductor pin junction, and as an example, solar cell 10 includes an n-type monocrystalline silicon substrate which is an n-type semiconductor substrate, and an i-type amorphous silicon layer, an n-type amorphous silicon layer, and an n-side electrode which are sequentially formed on a principal surface side of the n-type monocrystalline silicon substrate, and an i-type amorphous silicon layer, a p-type amorphous silicon layer, and a p-side electrode which are sequentially formed on the other principal surface side of the n-type monocrystalline silicon substrate. The n-side electrode and the p-side electrode are transparent electrodes such as, for example, indium tin oxide (ITO) electrodes.

Note that in the present embodiment, solar cell 10 is disposed such that the n side electrode is on the main light-receiving surface side (front surface protecting member 40 side) of solar cell module 1, yet the present embodiment is not limited to this. Further, solar cell module 1 is a monofacial module, and thus an electrode located on the back surface side (the p-side electrode in the present embodiment) is not necessarily transparent, and may be a reflective metal electrode, for example.

In each solar cell 10, a front surface is on the front surface protecting member 40 side, and a back surface is on the back surface protecting member 50 side. As illustrated in FIGS. 1B and 3, front side collector electrode 11 and back side collector electrode 12 are formed on solar cell 10. Front side collector electrode 11 is electrically connected to the front-surface side electrode (for example, the n side electrode) of solar cell 10. Back side collector electrode 12 is electrically connected to the back surface side electrode (for example, the p side electrode) of solar cell 10.

Front side collector electrode 11 and back side collector electrode 12 each include, for example, a plurality of finger electrodes formed linearly and orthogonally to the direction in which tab lines 20 extend, and a plurality of bus bar electrodes connected with the finger electrodes and formed linearly in the direction orthogonal to the finger electrodes (the direction in which tab lines 20 extend). The number of bus bar electrodes is the same as, for example, the number of tab lines 20, and is three in the present embodiment. Note that front side collector electrode 11 and back side collector electrode 12 have the same shape, but may have other shapes.

Front side collector electrode 11 and back side collector electrode 12 are made of a conductive material having low resistance, such as silver (Ag). For example, front side collector electrode 11 and back side collector electrode 12 can be formed by screen printing a conductive paste (such as silver paste) obtained by dispersing conductive filler such as silver in a binder resin, in a predetermined pattern.

In solar cell 10 having such a configuration, both the front surface and the back surface serve as light-receiving surfaces. If light enters solar cell 10, charge carriers are generated in a photoelectric converter of solar cell 10. The generated charge carriers are collected by front side collector electrode 11 and back side collector electrode 12, and flow to tab lines 20. The charge carriers generated in solar cell 10 can be efficiently taken out to an external circuit by disposing front side collector electrode 11 and back side collector electrode 12 as described above.

[Tab Line]

As illustrated in FIGS. 1A and 1B, tab lines 20 (interconnectors) electrically connect pairs of adjacent solar cells 10 in string 10S. As illustrated in FIGS. 1A and 2, in the present embodiment, each pair of adjacent solar cells 10 are connected by three tab lines 20 disposed substantially parallel to each other. Tab lines 20 extend in the alignment direction of the pair of solar cells 10 to be connected.

Tab lines 20 are conductive elongated lines, and are ribbon-shaped metallic foil, for example. Tab lines 20 can be produced by cutting, for example, metallic foil, such as copper foil or silver foil having surfaces entirely covered with solder, silver, or the like into strips having a predetermined length.

As illustrated in FIG. 1B, an end portion of each tab line 20 is disposed on the front surface of one solar cell 10 among two adjacent solar cells 10, and another end portion of tab line 20 is disposed on the back surface of other solar cell 10 among two adjacent solar cells 10.

Each tab line 20 electrically connects front side collector electrode 11 of one of two adjacent solar cells 10 to back side collector electrode 12 of the other of two adjacent solar cells 10. For example, tab lines 20 and bus bar electrodes of front side collector electrode 11 and back side collector electrode 12 on solar cell 10 are bonded together with a conductive adhesive such as a solder material.

[Light Reflector]

As illustrated in FIG. 3, conductive light-reflective film 31 is disposed on the back surface side of solar cell 10. Both sides of conductive light-reflective film 31 are light-reflective, and reflect incident light.

Conductive light-reflective film 31 is disposed, extending from an edge portion of solar cell 10 toward the space between solar cells 10. In the present embodiment, conductive light-reflective film 31 is disposed, extending across the space between two adjacent solar cells 10 spaced apart from each other. In FIG. 3, conductive light-reflective film 31 is disposed on the back surface side of first solar cell 10A and second solar cell 10B, extending across the space between first solar cell 10A and second solar cell 10B.

Insulating member 32 is disposed between the back surface of solar cell 10 and conductive light-reflective film 31. Specifically, conductive light-reflective film 31 is disposed on solar cell 10 via insulating member 32. In the present embodiment, insulating member 32 is disposed on the back surface side of first solar cell 10A and second solar cell 10B, extending across the space between first solar cell 10A and second solar cell 10B, similarly to conductive light-reflective film 31.

Insulating member 32 is made of a material harder than the material of back-surface side encapsulant 62. In the present embodiment, since back-surface side encapsulant 62 and front-surface side encapsulant 61 are made of the same material, insulating member 32 is made of a material harder than front-surface side encapsulant 61. As an example, insulating member 32 is a resin substrate made of a resin material, and is made of, for example, an insulating resin material.

As illustrated in FIG. 3, insulating member 32 is closer to the main light-receiving surface side of solar cell module 1 than conductive light-reflective film 31 is. Thus, insulating member 32 is achieved by a light transmitting material such as a transparent material, in order that the surface of conductive light-reflective film 31 on the main light-receiving surface side reflects light which has entered solar cell module 1 through the main light-receiving surface of solar cell module 1. In the present embodiment, the material of insulating member 32 is a transparent material.

Insulating member 32 has a refractive index higher than the refractive index of front-surface side encapsulant 61. Stated differently, the material of insulating member 32 has a refractive index higher than the refractive index of front-surface side encapsulant 61.

Examples of specific material of insulating member 32 include polyethylene terephthalate (PET) and an acrylic resin, and insulating member 32 is a transparent PET sheet in the present embodiment. The refractive index of insulating member 32 made of PET is higher than 1.5. Accordingly, ethylene vinyl acetate (EVA), for instance, which has a refractive index lower than 1.5 can be used for front-surface side encapsulant 61.

Recesses and protrusions 30a are formed in the surface of insulating member 32. With regard to recesses and protrusions 30a, for example, the height between a recessed portion (bottom) and a protruding portion (peak) is at least 5 μm and at most 100 μm, and the spacing (intervals) between adjacent protruding portions is at least 20 μm and at most 400 μm. In the present embodiment, the height between a recessed portion and a protruding portion is 12 μm, and the spacing (intervals) between adjacent protruding portions is 40 μm.

Conductive light-reflective film 31 is formed on the surface of insulating member 32. Conductive light-reflective film 31 is made of metal such as, for example, aluminum or silver. Conductive light-reflective film 31 which is a metal film is formed on the surface of recesses and protrusions 30a of insulating member 32 by, for example, vapor deposition. Accordingly, the surface shape of conductive light-reflective film 31 is given irregularities that conform to the irregularities of recesses and protrusions 30a. Thus, conductive light-reflective film 31 has a repeating structure of protruding portions and recessed portions. Note that in the present embodiment, conductive light-reflective film 31 is an aluminum vapor-deposited film.

As an example, recesses and protrusions 30a are formed into triangular grooves that extend along the lengths of light reflectors 30. Nevertheless, the shape of recesses and protrusions 30a is not limited to this, and recesses and protrusions 30a may be achieved by cones, quadrangular pyramids, polygonal pyramids, or combinations of such shapes, as long as recesses and protrusions 30a scatter light.

As illustrated in FIG. 3, in the present embodiment, insulating member 32 and conductive light-reflective film 31 are included in light reflector 30. Light reflector 30 is a stack structure of insulating member 32 and conductive light-reflective film 31. Specifically, insulating member 32 having a surface on which conductive light-reflective film 31 is formed is used as light reflector 30. Light reflector 30 is a plate member formed into a film or a sheet, and has the light reflective function to reflect incident light.

As illustrated in FIGS. 1A and 2, a plurality of light reflectors 30 are disposed. Each light reflector 30 is a light reflective sheet (light reflective film) having a tape-like shape that extends along the length of string 10S, an example of which is an elongated quadrilateral sheet shape. Each light reflector 30 has a length of 100 mm to 130 mm, a width of 1 mm to 20 mm, and a thickness of 0.05 mm to 0.5 mm, for example. As an example, light reflector 30 has a length of 125 mm, a width of 5 mm, and a thickness of 0.1 mm.

In the present embodiment, light reflector 30 has conductive light-reflective film 31 having a shape with irregularities, and thus can diffuse and reflect light which falls on light reflector 30, in a predetermined direction. Specifically, light reflector 30 is a light diffuse-reflective sheet which functions as a light diffuse-reflective member.

As illustrated in FIGS. 2 and 3, light reflector 30 is disposed on an edge portion of the back surface of solar cell 10 such that light reflector 30 is at least partially located beside solar cell 10. Specifically, light reflector 30 is disposed, extending from an edge portion of solar cell 10 toward a space between solar cells 10.

In the present embodiment, light reflector 30 is disposed, extending across the space between two adjacent solar cells 10 spaced apart from each other. Specifically, light reflector 30 is disposed on an edge portion of the back surface of first solar cell 10A and an edge portion of the back surface of second solar cell 10B such that light reflector 30 extends across the space between first solar cell 10A and second solar cell 10B.

More specifically, light reflector 30 (insulating member 32 and conductive light-reflective film 31) is disposed on the back surface side (back surface protecting member 50 side) of first solar cell 10A such that a lengthwise edge portion of light reflector 30 overlaps an edge portion of first solar cell 10A on the second solar cell 10B side. Light reflector 30 is disposed on the back surface side (back surface protecting member 50 side) of second solar cell 10B such that the other lengthwise edge portion of light reflector 30 overlaps an edge portion of second solar cell 10B on the first solar cell 10A side.

As illustrated in FIG. 1A, light reflectors 30 are each disposed in a space between two adjacent strings 10S, along the length of strings 10S. Specifically, light reflectors 30 are disposed in spaces between pairs of solar cells 10 within the space between strings 10S. Each light reflector 30 is disposed, extending across a space between two adjacent solar cells 10, and thus the width of each light reflector 30 is greater than the width of the space between two adjacent solar cells 10.

In the present embodiment, light reflector 30 is disposed on the back surface side of solar cell 10. If light reflector 30 is disposed on the front surface side of solar cell 10, an effectual region (power generation region) of solar cell 10 may be shaded by light reflector 30 in an overlapping portion of solar cell 10 with light reflector 30, which blocks light from entering the effectual region. Disposing light reflector 30 on the back surface side of solar cell 10 reduces such blocked light.

Light reflector 30 is disposed such that a surface of conductive light-reflective film 31 faces back surface protecting member 50. Stated differently, light reflector 30 is disposed such that insulating member 32 is located on the front surface protecting member 40 side, and conductive light-reflective film 31 is located on the back surface protecting member 50 side.

Light reflector 30 is sealed by encapsulant 60. Specifically, light reflector 30 is sealed by front-surface side encapsulant 61 and back-surface side encapsulant 62. More specifically, light reflector 30 on the front surface protecting member 40 side (main light-receiving surface side) is covered with front-surface side encapsulant 61, whereas light reflector 30 on the back surface protecting member 50 side is covered with back-surface side encapsulant 62.

As described above, a space between two adjacent solar cells 10 (first solar cell 10A and second solar cell 10B) is covered with light reflector 30 (conductive light-reflective film 31).

Accordingly, among light which has entered solar cell module 1 from the main light-receiving surface side, light which falls on the space between two adjacent solar cells 10 passes through front-surface side encapsulant 61, reaches light reflector 30, passes through insulating member 32, and diffused and reflected (scattered) by conductive light-reflective film 31 having a shape with irregularities. The diffused and reflected light is totally reflected by the interface between front surface protecting member 40 and an air layer or by the interface between front surface protecting member 40 and encapsulant 60, and is led to solar cell 10. As a result, also light which falls on a region in the space between two adjacent solar cells 10, which is an ineffectual region (in the present embodiment, a region in the space between two adjacent strings 10S, where incident light cannot contribute to power generation), can contribute to power generation effectively, and thus the efficiency of power generation of solar cell module 1 improves.

In particular, in the present embodiment, light reflector 30 is disposed in a power generation ineffectual region of an edge portion of solar cell 10. Accordingly, productivity improves, and also the capability of solar cells 10 to generate power can be efficiently utilized.

Furthermore, in the present embodiment, light reflector 30 is bonded to solar cell 10 in advance by adhesive member 33 formed on insulating member 32 on the solar cell 10 side, before the lamination processing described below. Adhesive member 33 is disposed between insulating member 32 and solar cell 10, and bonds insulating member 32 to solar cell 10. Note that adhesive member 33 is an adhesive layer, and is disposed on the entire surface of insulating member 32.

Adhesive member 33 is made of a material softer than the material of insulating member 32. For example, adhesive member 33 is a thermal adhesive or a pressure-sensitive adhesive which is made of EVA. Accordingly, light reflector 30 can be bonded and fixed to solar cell 10 by thermocompression bonding.

Figure 4:
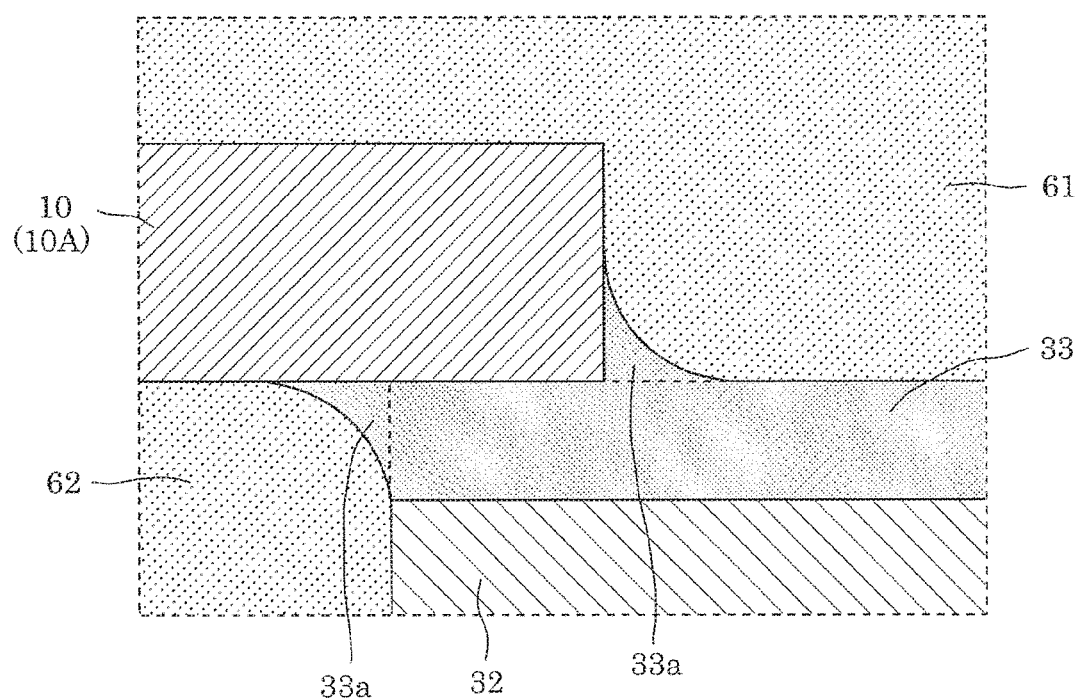
FIG. 4 is a cross-sectional view (enlarged cross-sectional view of region Y surrounded by the dashed line in FIG. 3) of the solar cell module according to Embodiment 1.

As described above, a material softer than the material of insulating member 32 is used as the material for adhesive member 33, so that as illustrated in FIG. 4, when light reflector 30 is bonded to solar cell 10 via adhesive member 33, fillets 33a of adhesive member 33 are formed on the back and lateral surfaces of solar cell 10. This results in an increase in the contact area of solar cell 10 and adhesive member 33, thus improving the adhesion between solar cell 10 and light reflector 30. FIG. 4 is an enlarged cross-sectional view of region Y surrounded by the dashed line in FIG. 3.

Note that in the present embodiment, insulating member 32 and conductive light-reflective film 31 are included in light reflector 30, yet insulating member 32 and conductive light-reflective film 31, and also adhesive member 33 may be included in light reflector 30. In other words, light reflector 30 may be a three-layered structure having insulating member 32, conductive light-reflective film 31, and adhesive member 33.

[Front Surface Protecting Member, Back Surface Protecting Member]

Front surface protecting member 40 (first protecting member) is a member which protects the front surface of solar cell module 1, and protects the inside of solar cell module 1 (such as solar cell 10) from the outside environment such as rainstorm and an external shock. As illustrated in FIG. 1B, front surface protecting member 40 is disposed on the front surface side of solar cell 10, and protects the light-receiving surface on the front side of solar cell 10.

Front surface protecting member 40 is achieved by a light transmitting member which transmits light in a wavelength range used for photoelectric conversion in solar cell 10. Front surface protecting member 40 is, for example, a glass substrate (clear glass substrate) made of a clear glass material or a resin substrate made of a hard resin material having a film-like or plate-like shape and light transmitting and waterproof properties.

On the other hand, back surface protecting member 50 (second protecting member) is a member which protects the back surface of solar cell module 1, and protects the inside of solar cell module 1 from the outside environment. As illustrated in FIG. 1B, back surface protecting member 50 is disposed on the back surface side of solar cell 10, and protects the light-receiving surface on the back surface side of solar cell 10.

Back surface protecting member 50 is a film-like or plate-like resin sheet made of a resin material such as polyethylene terephthalate (PET) or polyethylene naphthalate (PEN), for example.

Solar cell module 1 according to the present embodiment is a monofacial module, and thus back surface protecting member 50 may be a non-light transmitting plate or film. In this case, a non-light transmitting member (light blocking member) such as, for example, a black member or a laminated film such as a resin film which includes metallic foil such as aluminum foil may be used as back surface protecting member 50. Note that back surface protecting member 50 is not limited to a non-light transmitting member, and may be a light transmitting member such as a glass sheet or a glass substrate made of a glass material.

The space between front surface protecting member 40 and back surface protecting members 50 is filled with encapsulant 60. Front surface protecting member 40 and back surface protecting member 50 are bonded and fixed to solar cell 10 by encapsulant 60.

[Encapsulant]

Encapsulant (filler) 60 is located between front surface protecting member 40 and back surface protecting member 50. In the present embodiment, encapsulant 60 fills up the space between front surface protecting member 40 and back surface protecting member 50.

As illustrated in FIG. 3, encapsulant 60 includes front-surface side encapsulant 61 and back-surface side encapsulant 62. Front-surface side encapsulant 61 and back-surface side encapsulant 62 each cover solar cells 10 disposed in a matrix.

Front-surface side encapsulant 61 is formed, covering solar cells 10 and conductive light-reflective films 31 from the front surface side of solar cells 10. Specifically, front-surface side encapsulant 61 is formed, covering all solar cells 10 and all light reflectors 30 from the front surface protecting member 40 side.

Back-surface side encapsulant 62 is formed, covering solar cells 10 and conductive light-reflective films 31 from the back surface side of solar cells 10. Specifically, back-surface side encapsulant 62 is formed, covering all solar cells 10 and all light reflectors 30 from the back surface protecting member 50 side.

Solar cells 10 are entirely covered with encapsulant 60 by being subjected to lamination processing (laminated) in a state where, for example, solar cells 10 are sandwiched between front-surface side encapsulant 61 and back-surface side encapsulant 62 each formed into a sheet.

Specifically, solar cells 10 are connected by tab lines 20 to form strings 10S, and thereafter strings 10S are sandwiched between front-surface side encapsulant 61 and back-surface side encapsulant 62. Furthermore, front surface protecting member 40 is disposed over front-surface side encapsulant 61, and back surface protecting member 50 is disposed under back-surface side encapsulant 62. Then, the resultant structure is subjected to thermo compression bonding in a vacuum at a temperature of 100° C. or more, for example. Front-surface side encapsulant 61 and back-surface side encapsulant 62 are heated and melted by the thermo compression bonding, which produces encapsulant 60 which seals solar cells 10.

Front-surface side encapsulant 61 not yet subjected to lamination processing is, for example, a resin sheet made of a resin material such as EVA or polyolefin, and is disposed between front surface protecting member 40 and solar cells 10. Front-surface side encapsulant 61 fills up mainly a space between front surface protecting member 40 and solar cells 10 by lamination processing.

Front-surface side encapsulant 61 is made of a light transmitting material. In the present embodiment, a transparent resin sheet made of EVA is used as front-surface side encapsulant 61 not yet subjected to lamination processing.

Back-surface side encapsulant 62 not yet subjected to lamination processing is a resin sheet made of, for example, a resin material such as EVA or polyolefin, and is disposed between back surface protecting member 50 and solar cells 10. Back-surface side encapsulant 62 fills up mainly a space between back surface protecting member 50 and solar cells 10 by lamination processing.

Solar cell module 1 according to the present embodiment is a monofacial module, and thus the material of back-surface side encapsulant 62 is not limited to a light transmitting material, and may be a colored material such as a black material or a white material. As an example, a white resin sheet made of EVA is used as back-surface side encapsulant 62 not yet subjected to lamination processing.

[Frame]

Frame 70 is an outer frame which covers the perimeter edge portions of solar cell module 1. Frame 70 is, for example, an aluminum frame. As illustrated in FIG. 1A, frame 70 includes four portions fitted on the four sides of solar cell module 1. Frame 70 is bonded to the sides of solar cell module 1 with an adhesive, for example.

Note that solar cell module 1 includes a terminal box for taking out power generated by solar cells 10, which is not illustrated. The terminal box is fixed to back surface protecting member 50, for example. The terminal box may include a plurality of circuit components mounted on a circuit board.

Advantageous Effects and Others

The following describes advantageous effects of solar cell module 1 according to the present embodiment.

In solar cell module 1, insulating member 32 is disposed between the back surface of solar cell 10 and conductive light-reflective film 31, and the material of insulating member 32 is harder than the material of back-surface side encapsulant 62.

If a material softer than the material of back-surface side encapsulant 62 is used as a material of insulating member 32, for example when solar cells 10 on which light reflector 30 is disposed are sandwiched between front-surface side encapsulant 61 and back-surface side encapsulant 62 and subjected to lamination processing, insulating member 32 is squashed so that a portion of conductive light-reflective film 31 may come into contact with solar cell 10. In particular, if insulating member 32 is made of a resin material, insulating member 32 is likely to be easily squashed during lamination processing.

If conductive light-reflective film 31 comes into contact with solar cell 10, insulation between solar cell 10 and conductive light-reflective film 31 cannot be maintained. For example, a problem that leakage current occurs between adjacent solar cells 10 via conductive light-reflective film 31 arises.

In particular, when conductive light-reflective film 31 is disposed extending across a space between two adjacent solar cells 10, a leak path is created by conductive light-reflective film 31 between solar cells 10 if insulating member 32 is squashed so that the two edge portions of conductive light-reflective film 31 come into contact with two solar cells 10.

In view of this, by using a harder material for insulating member 32 than the material of back-surface side encapsulant 62, even if pressure is applied to conductive light-reflective film 31 and solar cells 10 by, for instance, lamination processing, conductive light-reflective film 31 is prevented from coming into contact with solar cells 10 due to insulating member 32 being squashed. This maintains insulation between conductive light-reflective film 31 and solar cells 10. Accordingly, solar cell module 1 with high insulating reliability is achieved even if solar cell module 1 includes light reflectors 30.

Note that the hardness of insulating member 32 and back-surface side encapsulant 62 is the hardness when lamination processing is performed at a treatment temperature of at least 100° C. and at most 140° C., for example, and can be expressed by, for example, an elastic modulus at the time of lamination processing. In this case, as an example, the elastic modulus of insulating member 32 is $10^8$ Pa to $10^{10}$ Pa, and the elastic modulus of back-surface side encapsulant 62 is $10^5$ Pa to $10^7$ Pa. Note that the elastic modulus at the time of lamination processing is determined based on the storage modulus at 100° C., after carrying out tensile-mode measurement at a temperature increased by 3° C. per minute in a range from −50° C. to 150° C. for a measurement sampling period based on a constant frequency (10 Hz).

Alternatively, the hardness of insulating member 32 and back-surface side encapsulant 62 may be expressed as softening points. In this case, as an example, the softening point of insulating member 32 is in a range from 150° C. to 300° C., and the softening point of back-surface side encapsulant 62 is in a range from 70° C. to 140° C.

In the present embodiment, insulating member 32 is disposed on the back surface side of two adjacent solar cells 10, extending across the space therebetween.

Accordingly, even if conductive light-reflective film 31 is disposed extending across a space between two adjacent solar cells 10, insulating member 32 is prevented from being squashed so that the two edge portions of conductive light-reflective film 31 are prevented from coming into contact with two solar cells 10. Accordingly, insulation between conductive light-reflective film 31 and solar cells 10 can be maintained.

In the present embodiment, adhesive member 33 is disposed between insulating member 32 and solar cells 10.

Accordingly, insulating member 32 (light reflector 30) having a surface on which conductive light-reflective film 31 is formed can be readily bonded to solar cell 10 in a predetermined position before lamination processing. Thus, light reflector 30 can be temporarily attached to solar cell 10 with ease before lamination processing. Accordingly, conductive light-reflective film 31 (light reflector 30) can be disposed in a predetermined position, and thus light which has fallen on conductive light-reflective film 31 can be led to a desired portion of solar cell 10. This results in desired effects of improvement in efficiency of power generation achieved by disposing conductive light-reflective film 31 (light reflector 30).

In the present embodiment, adhesive member 33 is made of a material softer than the material of insulating member 32.

Accordingly, as illustrated in FIG. 4, before lamination processing, fillets 33a of adhesive member 33 can be formed at contact surfaces of solar cell 10 with adhesive member 33 when insulating member 32 (light reflector 30) is bonded to solar cell 10 via adhesive member 33. As a result, the contact area between solar cell 10 and adhesive member 33 can be increased, and thus the adhesion between solar cell 10 and insulating member 32 (light reflector 30) improves. Accordingly, insulating member 32 (light reflector 30) having a surface on which conductive light-reflective film 31 is formed can be readily bonded to solar cell 10 in a predetermined position, before lamination processing.

Note that the hardness (softness) of adhesive member 33 can also be expressed using, for instance, an elastic modulus, similarly to the hardness of insulating member 32 and back-surface side encapsulant 62.

Insulating member 32 is made of a transparent material in the present embodiment.

Accordingly, this makes a portion between the back surface of solar cell 10 and conductive light-reflective film 31 transparent, in a location where conductive light-reflective film 31 overlaps solar cell 10. As a result, among light reflected by conductive light-reflective film 31, light reflected in the vicinity of an edge portion of solar cell 10 toward the back surface of solar cell 10 is allowed to pass through transparent insulating member 32 and enter solar cell 10 through the back surface, as illustrated in FIG. 3. Accordingly, light reflected by conductive light-reflective film 31 can be used effectively, which improves efficiency of power generation.

In the present embodiment, conductive light-reflective film 31 is a metal film, and back-surface side encapsulant 62 is made of a white material.

A large amount of light which has entered solar cell module 1 through the main light-receiving surface enters solar cell 10 through the front surface, and is photoelectrically converted by solar cell 10. At this time, a portion of the light which has entered solar cell 10 through the front surface passes through solar cell 10. In particular, long-wavelength light tends to pass through solar cell 10.

In view of this, in the present embodiment, back-surface side encapsulant 62 which covers the back surface of solar cell 10 is made of a white material, and conductive light-reflective film 31 disposed between solar cells 10 is a metal film.

Accordingly, in a region under the back surface of solar cell 10, light which has passed through solar cell 10 can be reflected by back-surface side encapsulant 62, and thus light which passes through solar cell 10 can also contribute to power generation. Furthermore, light which has entered solar cells 10 can be reflected by conductive light-reflective film 31 both when the light is short-wavelength light and when the light is long-wavelength light, and thus light which falls on a space between solar cells 10 can also contribute to power generation. Accordingly, the efficiency of power generation of solar cell module 1 can be further improved.

Figure 5:
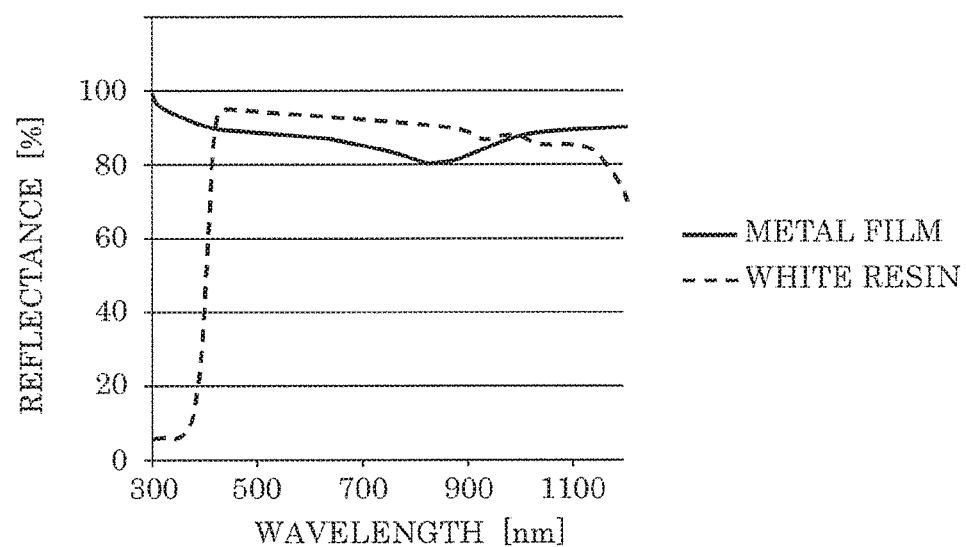
FIG. 5 illustrates light reflectivity characteristics of a conductive light-reflective film and a back-surface side encapsulant used in the solar cell module according to Embodiment 1.

FIG. 5 illustrates the reflectance of conductive light-reflective film 31 and back-surface side encapsulant 62 in the present embodiment. In the present embodiment, conductive light-reflective film 31 (metal film) is an aluminum metal film (solid line in FIG. 5), and back-surface side encapsulant 62 is made of a white resin (dashed line in FIG. 5). Note that a light transmitting resin material such as EVA that contains metal particulates such as titanium oxide (titania) particles can be used as the white resin.

Accordingly, in the present embodiment, the optimal materials are selected for components in a region under the back surface of solar cell 10 and between solar cells 10. Specifically, a material having a relatively higher reflectance for long-wavelength light than for short-wavelength light is used as back-surface side encapsulant 62 disposed in a region under the back surface of solar cell 10. In contrast, the material having a high reflectance not only for long-wavelength light but also for short-wavelength light is used as conductive light-reflective film 31 disposed between solar cells 10. Accordingly, light which enters solar cell module 1 can be used to the utmost.

In the present embodiment, the refractive index of insulating member 32 is higher than the refractive index of front-surface side encapsulant 61 which covers insulating member 32.

Accordingly, as illustrated in FIG. 3, light which has entered solar cell module 1 from the main light-receiving surface side and is reflected by conductive light-reflective film 31 can be refracted toward solar cell 10 at the interface between insulating member 32 and front-surface side encapsulant 61. Specifically, light reflected by conductive light-reflective film 31 can be caused to enter front surface protecting member 40 at a shallower angle. As a result, more light can be reflected by front surface protecting member 40, and thus the reflected light can be caused to re-enter solar cell 10 at a spot further away from conductive light-reflective film 31. For example, light reflected by conductive light-reflective film 31 can be caused to even reach a spot near tab line 20. Accordingly, the efficiency of power generation of solar cell module 1 can be further improved.

Figure 6:
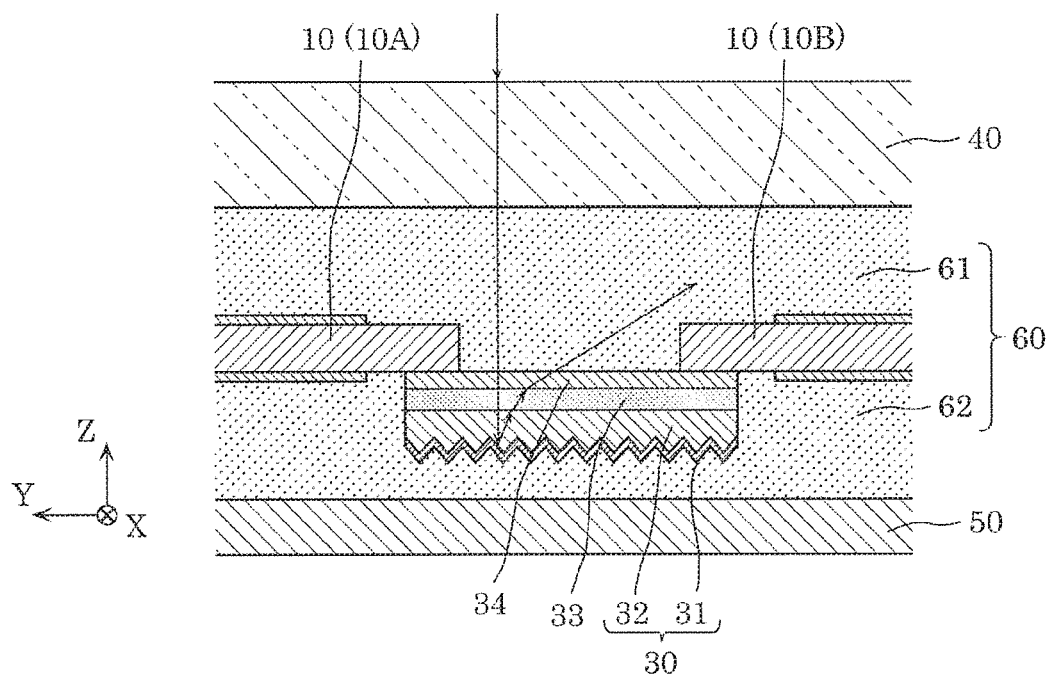
FIG. 6 is an enlarged cross-sectional view around the light reflector of the solar cell module according to another aspect of Embodiment 1.

In this case, as illustrated in FIG. 6, intermediate member 34 may be further disposed between insulating member 32 and solar cell 10. The refractive index of intermediate member 34 is lower than the refractive index of insulating member 32, and is higher than the refractive index of front-surface side encapsulant 61.

Accordingly, light reflected by conductive light-reflective film 31 can be caused to enter front surface protecting member 40 at a still shallower angle, and thus still more light can be reflected by front surface protecting member 40. Accordingly, the efficiency of power generation of solar cell module 1 can be further improved.

Variation 1 of Embodiment 1

Figure 7:
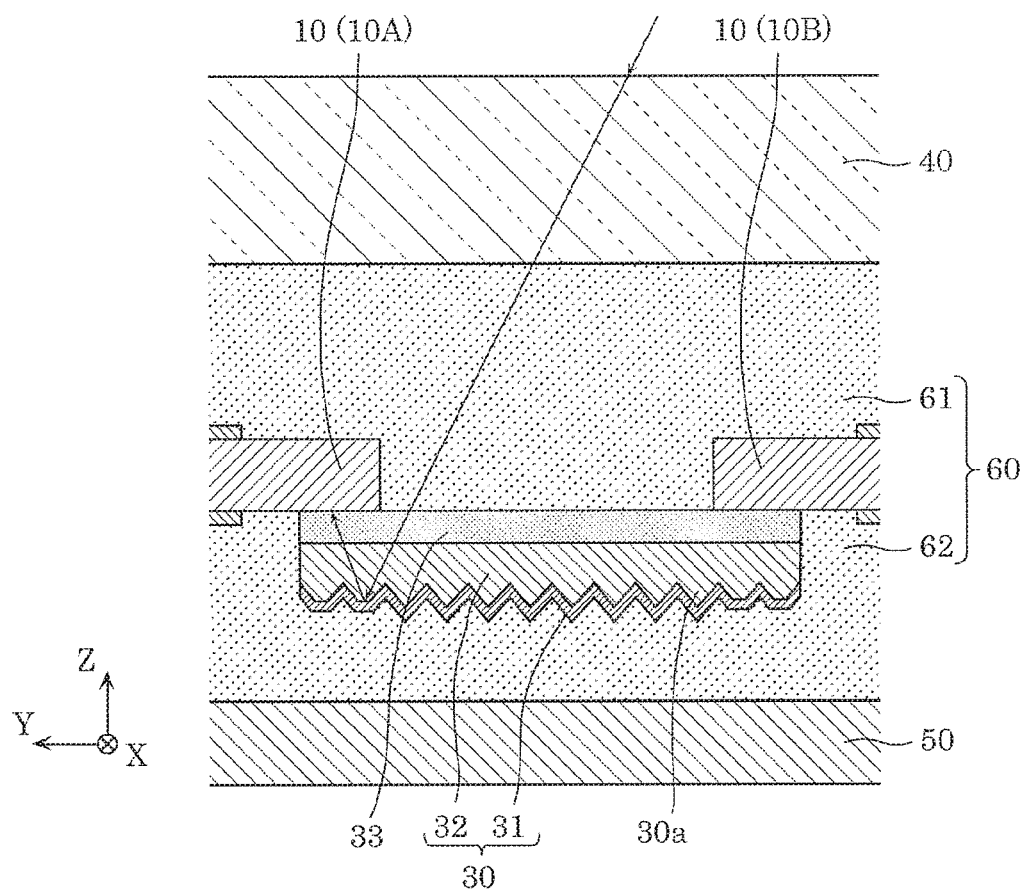
FIG. 7 is an enlarged cross-sectional view around a light reflector of a solar cell module according to Variation 1 of Embodiment 1.

FIG. 7 is an enlarged cross-sectional view around a light reflector of a solar cell module according to Variation 1 of Embodiment 1.

As illustrated in FIG. 7, in the solar cell module according to this variation, the shape of protruding portions of conductive light-reflective film 31 is different from that of solar cell module 1 according to Embodiment 1 described above.

Specifically, in this variation, portions of conductive light-reflective film 31 that overlap solar cells 10 via insulating member 32 have protruding portions having flat surfaces. Specifically, conductive light-reflective film 31 having a shape with irregularities has protruding portions having flat surfaces, in portions that overlap solar cells 10 via insulating member 32 (region directly under the back surface of solar cell 10).

Accordingly, as illustrated in FIG. 7, light which obliquely travels between conductive light-reflective film 31 and the back surface of solar cell 10 is reflected by the flat surface of a protruding portion of conductive light-reflective film 31, and is caused to enter solar cell 10. Accordingly, the efficiency of power generation of solar cell module 1 can be further improved.

Furthermore, in the variation, only a protruding portion located in a region directly under the back surface of solar cell 10 is flat, whereas a protruding portion located between solar cells 10 is not flat.

Accordingly, utilization efficiency of light which obliquely travels on the back side of solar cell 10 can be improved while maintaining high utilization efficiency of light which falls on conductive light-reflective film 31 at right angles between solar cells 10. Accordingly, the efficiency of power generation of solar cell module 1 can be further improved.

Further, the flat shape of a protruding portion of conductive light-reflective film 31 can be formed by pressing and deforming the peak of the protruding portion. In this case, protruding portions can be flattened simultaneously with bonding light reflector 30 to solar cell 10 via adhesive member 33. Specifically, when light reflector 30 and solar cell 10 are bonded together, for example, an edge portion of light reflector 30 and an edge portion of solar cell 10 are stacked via adhesive member 33, and pressure is applied to the edge portion of light reflector 30 by roller pressing or hot pressing, so that surfaces of the protruding portions of conductive light-reflective film 31 can be flattered by the pressure applied this time.

According to this variation, when protruding portions of conductive light-reflective film 31 are flattened is not limited to the time when light reflector 30 is bonded to solar cell 10, and protruding portions may be separately flattened before or after light reflector 30 is bonded to solar cell 10. In addition, protruding portions may not be pressed into a flat form, but protruding portions each having a flat surface may be formed in advance. For example, surfaces of one or more protruding portions among recesses and protrusions 30a of insulating member 32 are flattened in advance so that conductive light-reflective film 31 having protruding portions with flat surfaces can be formed.

Note that this variation may be applied to other embodiments.

Variation 2 of Embodiment 1

Figure 8:
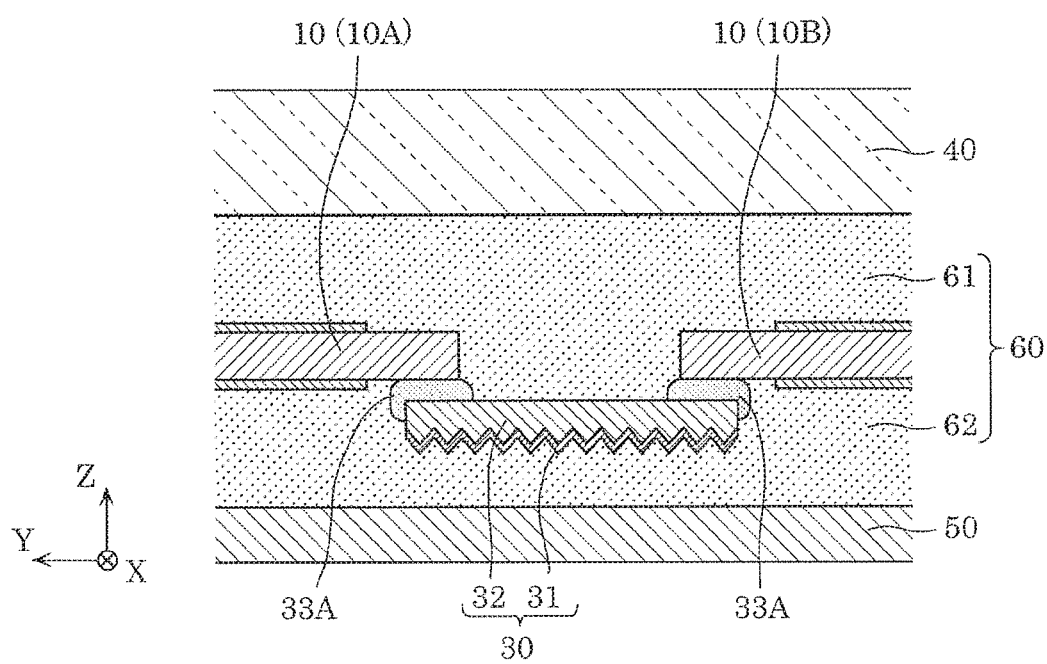
FIG. 8 is an enlarged cross-sectional view around a light reflector of a solar cell module according to Variation 2 of Embodiment 1.

FIG. 8 is an enlarged cross-sectional view around a light reflector of a solar cell module according to Variation 2 of Embodiment 1.

As illustrated in FIG. 8, the solar cell module according to this variation is different from solar cell module 1 according to Embodiment 1 described above in, for example, the disposition and shape of an adhesive member.

Adhesive member 33 according to Embodiment 1 described above is disposed entirely over insulating member 32, yet adhesive member 33A according to this variation is disposed only between solar cell 10 and insulating member 32. Adhesive member 33A is a thermal adhesive or a pressure-sensitive adhesive, similarly to Embodiment 1.

Specifically, adhesive members 33A are disposed at two locations, namely, between the back surface of first solar cell 10A and insulating member 32 and between the back surface of second solar cell 10B and insulating member 32, but not disposed between first solar cell 10A and second solar cell 10B.

Thus, according to Embodiment 1 described above, light which enters light reflector 30 at right angles passes through adhesive member 33, and then falls on conductive light-reflective film 31. In contrast, in this variation, light which enters light reflector 30 at right angles directly falls on conductive light-reflective film 31.

Specifically, light which enters light reflector 30 at right angles is slightly absorbed by adhesive member 33 in Embodiment 1, but not absorbed by adhesive member 33A in this variation. Accordingly, the efficiency of power generation of solar cell module 1 can be further improved.

Figure 9:
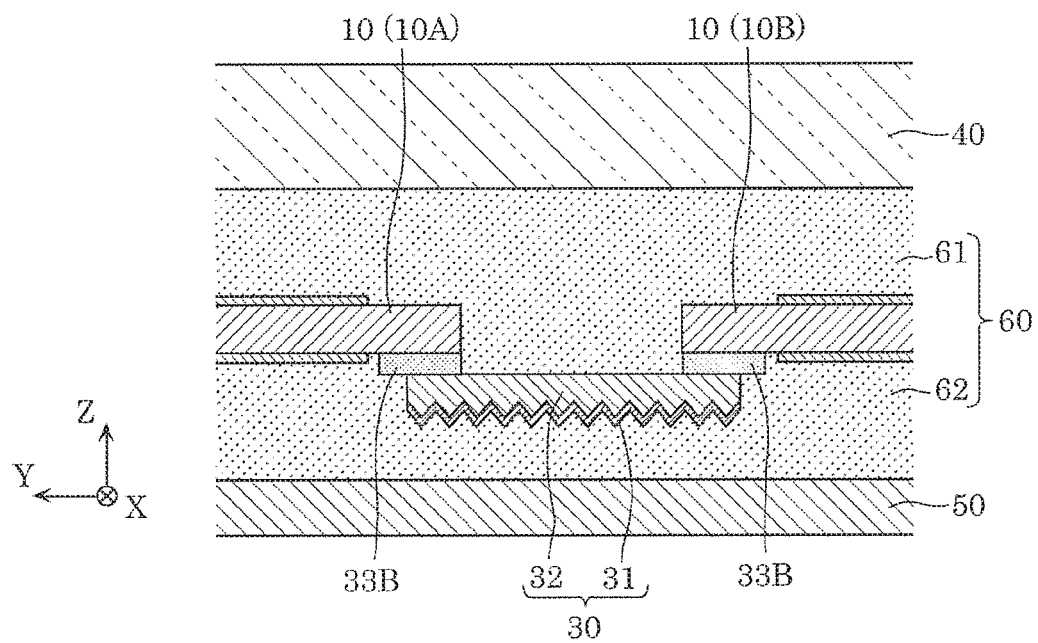
FIG. 9 is an enlarged cross-sectional view of the light reflector of the solar cell module according to another aspect of Variation 2 of Embodiment 1.

Note that as illustrated in FIG. 9, adhesive members 33B which are double-sided tapes may be used, instead of adhesive members 33A which are adhesives.

Furthermore, this variation may be applied to other embodiments.

Embodiment 2

Figure 10:
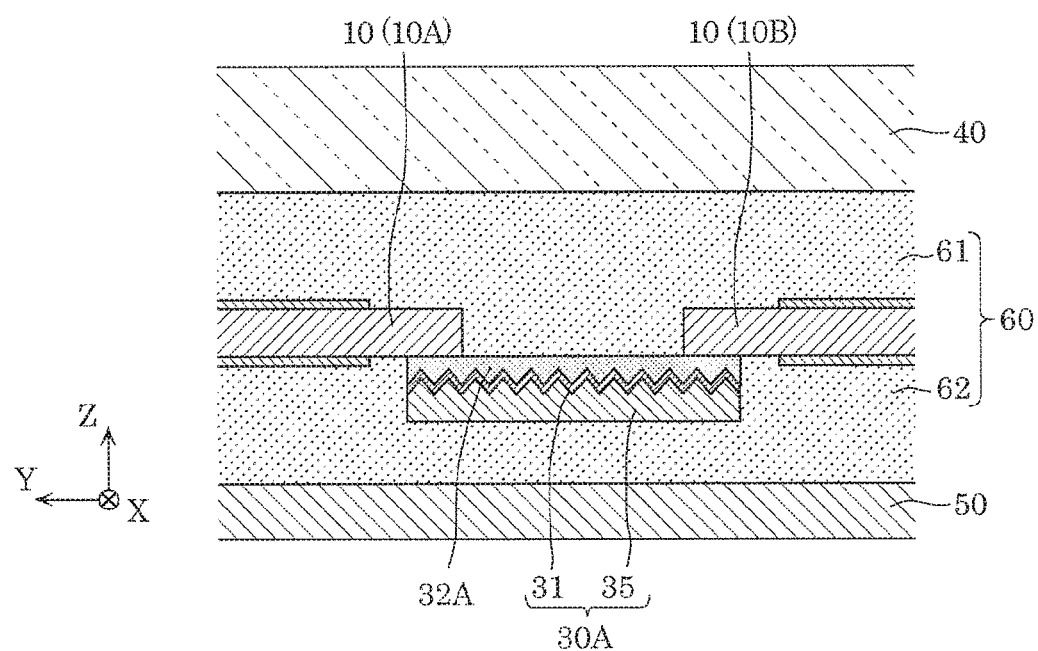
FIG. 10 is an enlarged cross-sectional view around a light reflector of a solar cell module according to Embodiment 2.

The following describes a solar cell module according to Embodiment 2 with reference to FIG. 10. FIG. 10 is an enlarged cross-sectional view around a light reflector of the solar cell module according to Embodiment 2.

As illustrated in FIG. 10, in the solar cell module according to the present embodiment, light reflector 30A includes conductive light-reflective film 31 and resin member 35. Light reflector 30 is disposed such that resin member 35 is located on the back surface protecting member 50 side, and furthermore, conductive light-reflective film 31 is located on the front surface protecting member 40 side. Specifically, light reflector 30A is disposed such that the surface of conductive light-reflective film 31 faces front surface protecting member 40, and conductive light-reflective film 31 is oriented toward solar cells 10.

Resin member 35 is disposed on the surface of conductive light-reflective film 31 which is located on a side opposite insulating member 32A. Resin member 35 is made of a resin material such as PET or an acrylic resin, for example. Recesses and protrusions are formed in the surface of resin member 35, and conductive light-reflective film 31 is formed into a shape that conforms to the recesses and protrusions.

Similarly to Embodiment 1, insulating member 32A is disposed between the back surface of solar cell 10 and conductive light-reflective film 31. Similarly to the material of insulating member 32 in Embodiment 1, insulating member 32A is made of a material harder than the material of back-surface side encapsulant 62. Insulating member 32A is disposed on the back surface side of first solar cell 10A and second solar cell 10B, extending across a space between first solar cell 10A and second solar cell 10B.

In the present embodiment, adhesive member 33 according to Embodiment 1 is not disposed, and insulating member 32A itself serves as an adhesive. Stated differently, insulating member 32A functions as an adhesive member which bonds conductive light-reflective film 31 to solar cell 10.

Note that a material having a higher refractive index than the refractive index of front-surface side encapsulant 61 may be used for insulating member 32A.

As stated above, the solar cell module according to the present embodiment also yields equivalent advantageous effects to those achieved in Embodiment 1. For example, also in the present embodiment, insulating member 32A is made of a material harder than the material of back-surface side encapsulant 62, and thus insulating member 32A can be prevented from being squashed due to, for instance, the pressure applied during lamination processing so that conductive light-reflective film 31 and solar cell 10 do not come into contact with each other. Accordingly, the insulation between solar cell 10 and conductive light-reflective film 31 can be maintained.

Further, in the present embodiment, resin member 35 is disposed on the surface of conductive light-reflective film 31 which is located on the side opposite insulating member 32A.

This prevents deterioration of conductive light-reflective film 31, and thus desired effects of improvement in efficiency of power generation achieved by disposing conductive light-reflective film 31 (light reflector 30A) can be maintained.

Variation 1 of Embodiment 2

Figure 11:
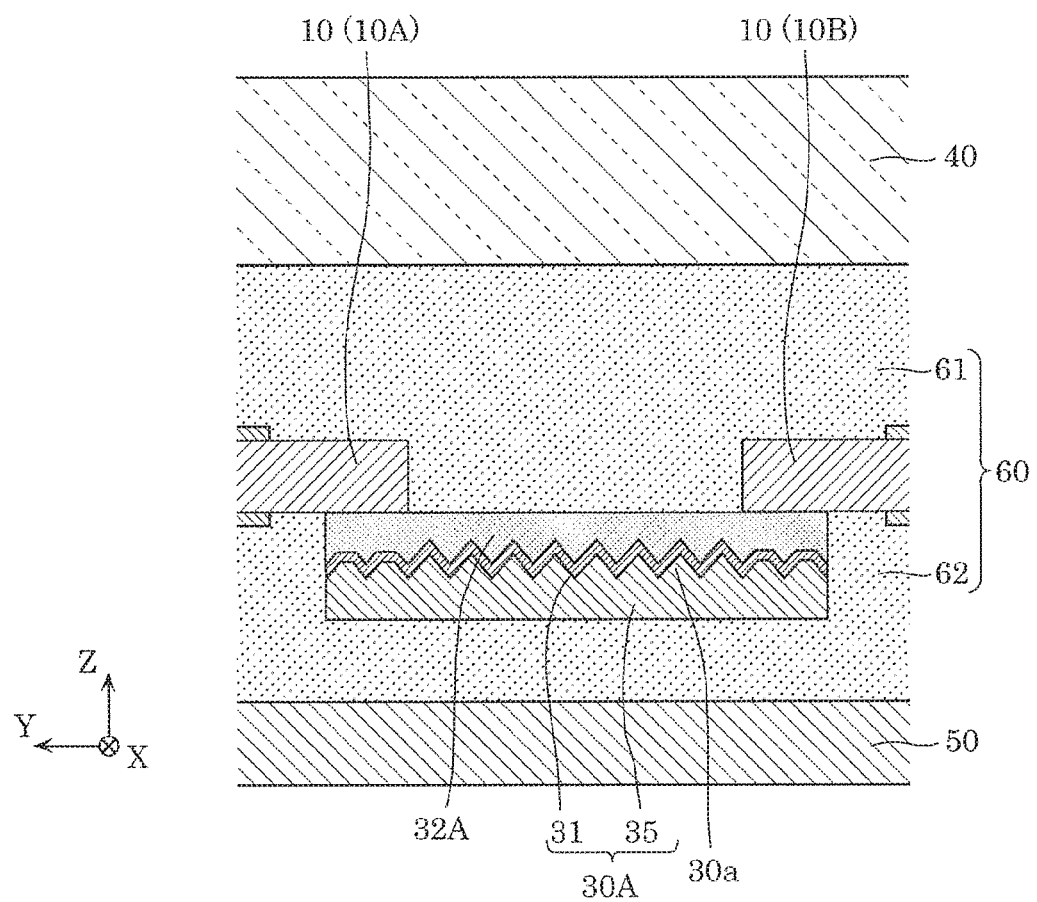
FIG. 11 is an enlarged cross-sectional view of a solar cell module according to Variation 1 of Embodiment 2.

FIG. 11 is an enlarged cross-sectional view around a light reflector of a solar cell module according to Variation 1 of Embodiment 2.

As illustrated in FIG. 11, the solar cell module according to this variation is different from the solar cell module according to Embodiment 2 described above in the shape of a protruding portion of conductive light-reflective film 31.

Specifically, conductive light-reflective film 31 in this variation has the same configuration as that in Variation 1 of Embodiment 1, and recesses and protrusions 30a of portions of conductive light-reflective film 31 that overlap solar cells 10 via insulating member 32A include protruding portions having flat surfaces.

Accordingly, light which obliquely travels between conductive light-reflective film 31 and the back surfaces of solar cells 10 can be reflected by the flat surfaces of the protruding portions of conductive light-reflective film 31 so as to be caused to enter solar cells 10, and thus the efficiency of power generation of the solar cell module can be further improved.

Furthermore, also in this variation, only a protruding portion located in a region directly under the back surface of solar cell 10 is flat, whereas a protruding portion located between solar cells 10 is not flat.

Accordingly, the utilization efficiency of light which obliquely travels on the back side of solar cell 10 can be improved while maintaining high utilization efficiency of light which falls on conductive light-reflective film 31 at right angles between solar cells 10.

In this variation, light reflector 30A is disposed under the back surfaces of solar cells 10 such that conductive light-reflective film 31 is oriented toward solar cells 10. Stated differently, light reflector 30A is disposed such that conductive light-reflective film 31 is close to solar cells 10. Thus, maintaining insulation is an issue.

In view of this respect, in this variation, portions of conductive light-reflective film 31 that overlap solar cells 10 include protruding portions having flat surfaces. This increases the distance between conductive light-reflective film 31 and solar cells 10, and thus insulation can be improved.

Figure 12:
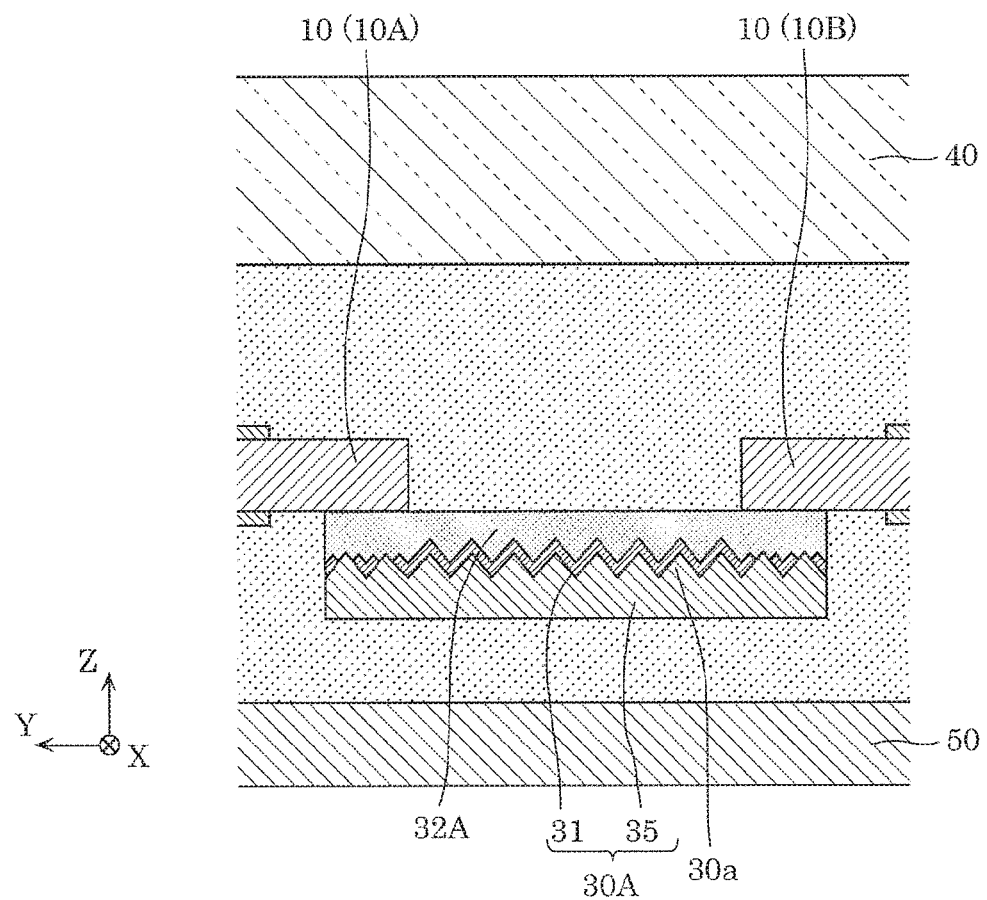
FIG. 12 is an enlarged cross-sectional view around a light reflector of the solar cell module according to another aspect of Variation 1 of Embodiment 2.

Note that in FIG. 11, the peaks of protruding portions of conductive light-reflective film 31 are pressed into flat surfaces, yet as illustrated in FIG. 12, the distance between conductive light-reflective film 31 and solar cells 10 may be increased by partially removing protruding portions in portions of conductive light-reflective film 31 that overlap solar cells 10 via insulating member 32A. For example, a protruding portion of conductive light-reflective film 31 can be partially removed by cutting off the peak of the protruding portion.

This variation may be applied to other embodiments.

Variation 2 of Embodiment 2

Figure 13:
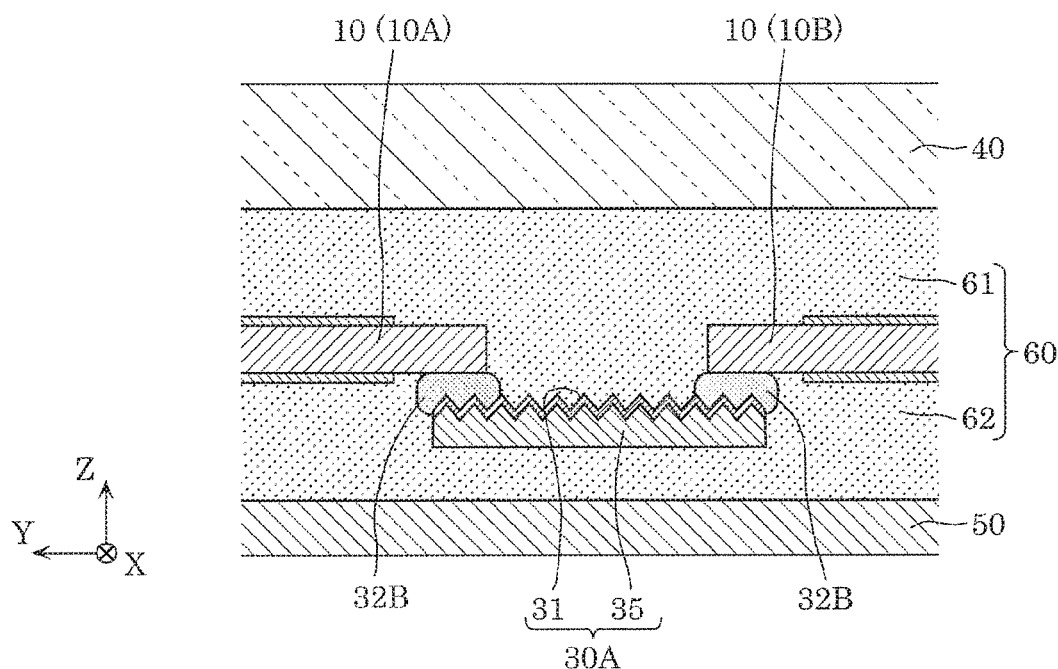
FIG. 13 is an enlarged cross-sectional view around a light reflector of a solar cell module according to Variation 2 of Embodiment 2.

FIG. 13 is an enlarged cross-sectional view around a light reflector of a solar cell module according to Variation 2 of Embodiment 2.

As illustrated in FIG. 13, the solar cell module according to this variation is different from the solar cell module according to Embodiment 2 described above, in the disposition and shapes of insulating members.

Insulating member 32A according to Embodiment 2 described above is disposed entirely over conductive light-reflective film 31, yet insulating members 32B according to this variation are disposed only between conductive light-reflective film 31 and solar cells 10. Also in this variation, insulating members 32B are adhesives.

Specifically, insulating members 32B are disposed at two locations, namely between the back surface of first solar cell 10A and conductive light-reflective film 31 and between the back surface of second solar cell 10B and conductive light-reflective film 31, but not disposed between first solar cell 10A and second solar cell 10B.

Thus, according to Embodiment 2 described above, light which enters light reflector 30A at right angles passes through insulating member 32A, and falls on conductive light-reflective film 31, whereas according to this variation, light which enters light reflector 30A at right angles directly falls on conductive light-reflective film 31.

Specifically, light which enters light reflector 30A at right angles is slightly absorbed by insulating member 32A according to Embodiment 2, but is not absorbed by insulating member 32B according to this variation. Accordingly, the efficiency of power generation of the solar cell module can be further improved.

Figure 14:
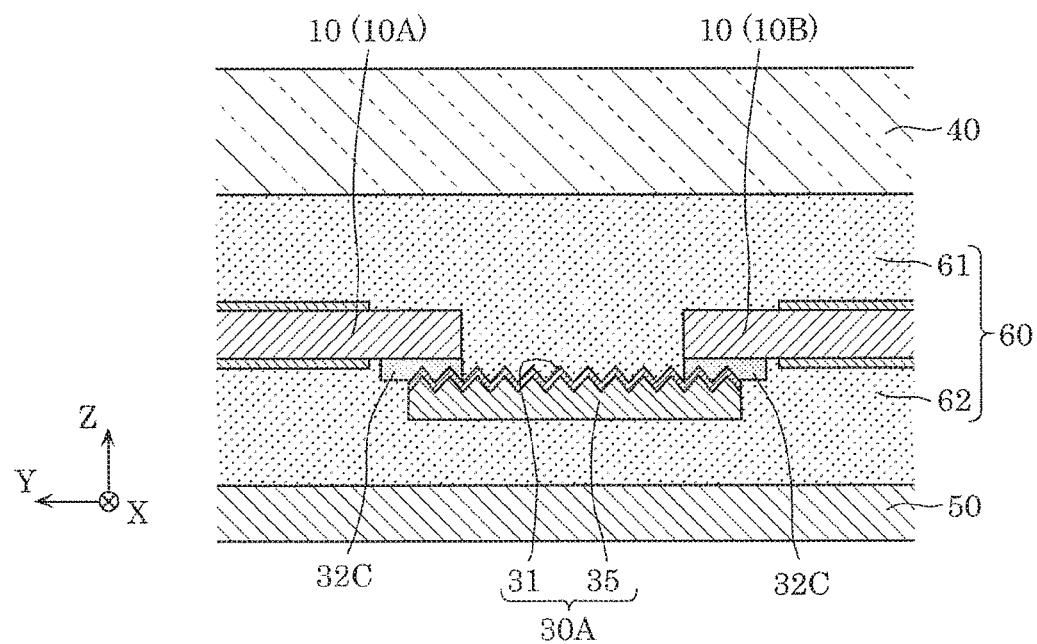
FIG. 14 is an enlarged cross-sectional view around the light reflector of the solar cell module according to another aspect of Variation 2 of Embodiment 2.

Note that insulating members 32C which are double-sided tapes may be used instead of insulating members 32B which are adhesives, as illustrated in FIG. 14. Also in this case, insulating members 32C are made of a material harder than the material of back-surface side encapsulant 62.

This variation may be applied to other embodiments.

Embodiment 3

Figure 15:
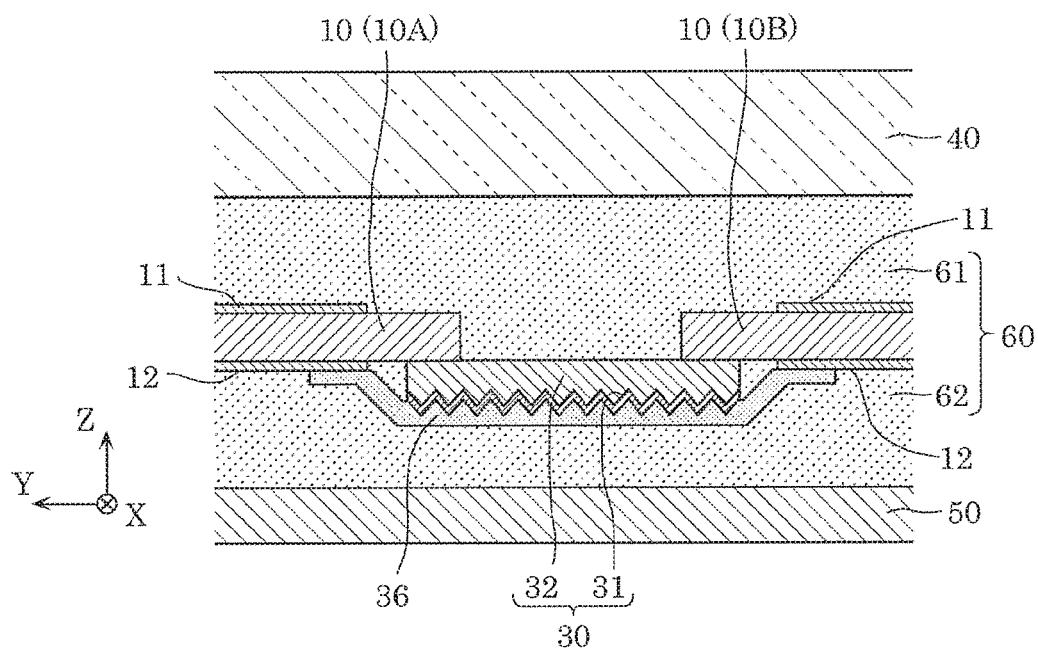
FIG. 15 is an enlarged cross-sectional view around a light reflector of a solar cell module according to Embodiment 3.

The following describes a solar cell module according to Embodiment 3 with reference to FIG. 15. FIG. 15 is an enlarged cross-sectional view around a light reflector of the solar cell module according to Embodiment 3.

As illustrated in FIG. 15, in the solar cell module according to the present embodiment, light reflector 30 which includes conductive light-reflective film 31 and insulating member 32 is fixed by adhesive tape (fixing tape) 36.

Specifically, adhesive tape 36 is applied to the back surface of first solar cell 10A and the back surface of second solar cell 10B, across conductive light-reflective film 31 and insulating member 32. Adhesive tape 36 is made of an insulating resin material, for example, and an adhesive layer is formed on at least one side of adhesive tape 36.

As stated above, the solar cell module according to the present embodiment also yields equivalent advantageous effects to those achieved in Embodiment 1. For example, insulating member 32 is made of a material harder than the material of back-surface side encapsulant 62 also in the present embodiment. Thus, insulating member 32 is prevented from being squashed due to, for instance, the pressure applied during lamination processing so that conductive light-reflective film 31 and solar cell 10 do not come into contact with each other. Accordingly, the insulation between solar cell 10 and conductive light-reflective film 31 can be maintained.

Further, in the present embodiment, adhesive tape 36 fixes components between solar cells 10, covering light reflector 30. This yields a solar cell module that has still higher insulation reliability.

In the present embodiment, light reflector 30 is disposed, extending across a space between strings, and thus adhesive tape 36 is also disposed, extending across the space between the strings. Accordingly, adhesive tape 36 can prevent displacement of the strings during the lamination processing.

In particular, when a non-crosslinking filler is used as encapsulant 60 (front-surface side encapsulant 61 and back-surface side encapsulant 62), a string is greatly displaced during lamination processing. Accordingly, displacement of a string can be effectively prevented by pressing and fixing light reflector 30 using adhesive tape 36.

Moreover, adhesive tape 36 is disposed on the back surface side of solar cell 10. Accordingly, light which has entered the solar cell module is not influenced (shaded, absorbed, and so on) by adhesive tape 36.

Figure 16:
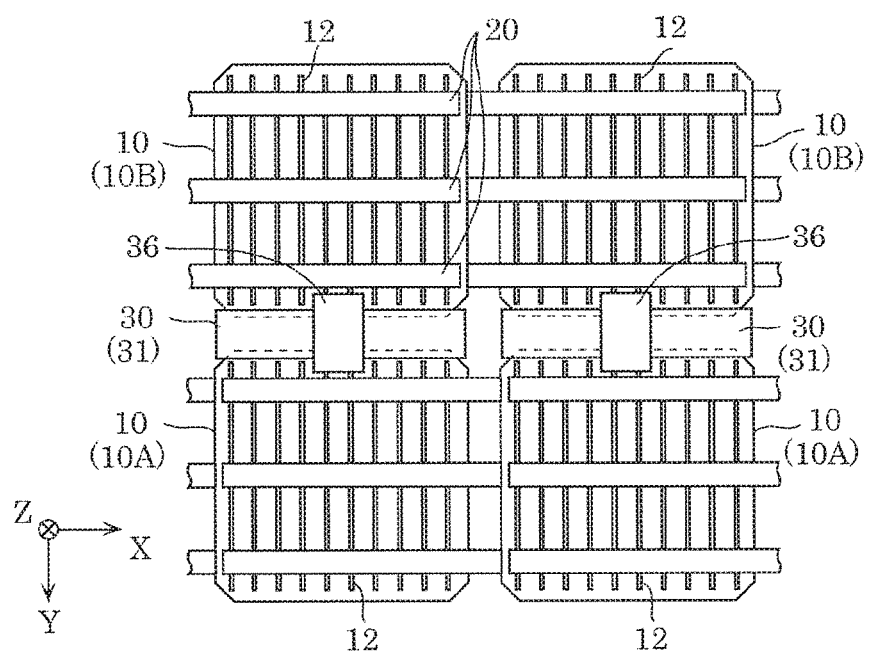
FIG. 16 is an enlarged plan view of the solar cell module according to Embodiment 3.
Figure 17:
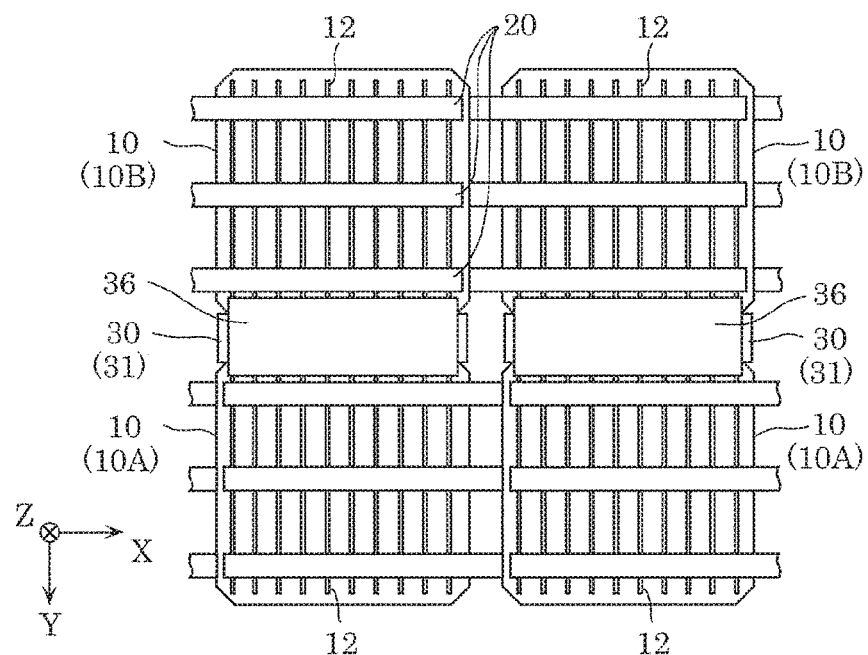
FIG. 17 is an enlarged plan view of the solar cell module according to another aspect of Embodiment 3.

Note that adhesive tape 36 may be applied so as to cover just a portion of light reflector 30 (for example, the central portion of light reflector 30) as illustrated in FIG. 16, or may be applied so as to entirely cover light reflector 30 as illustrated in FIG. 17. FIGS. 16 and 17 illustrate states when solar cells 10 are viewed from the back side.

Variation 1 of Embodiment 3

Figure 18:
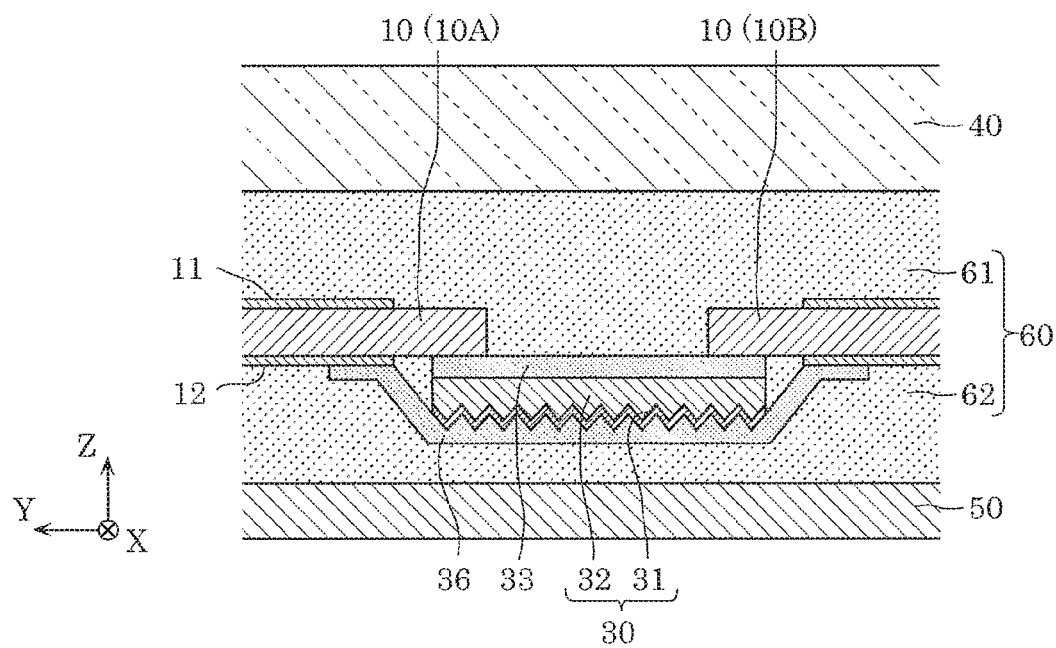
FIG. 18 is an enlarged cross-sectional view around a light reflector of a solar cell module according to Variation 1 of Embodiment 3.

FIG. 18 is an enlarged cross-sectional view around a light reflector of a solar cell module according to Variation 1 of Embodiment 3.

As illustrated in FIG. 18, the solar cell module according to this variation has a configuration of the solar cell module according to Embodiment 3 described above in which adhesive member 33 is formed between light reflector 30 and solar cells 10. Adhesive member 33 is disposed on the entire surface of insulating member 32.

Accordingly, adhesive tape 36 can be applied to solar cells 10 in a state where light reflector 30 is temporarily attached to solar cells 10 by adhesive member 33. Accordingly, light reflector 30 can be accurately bonded to solar cells 10.

Variation 2 of Embodiment 3

Figure 19:
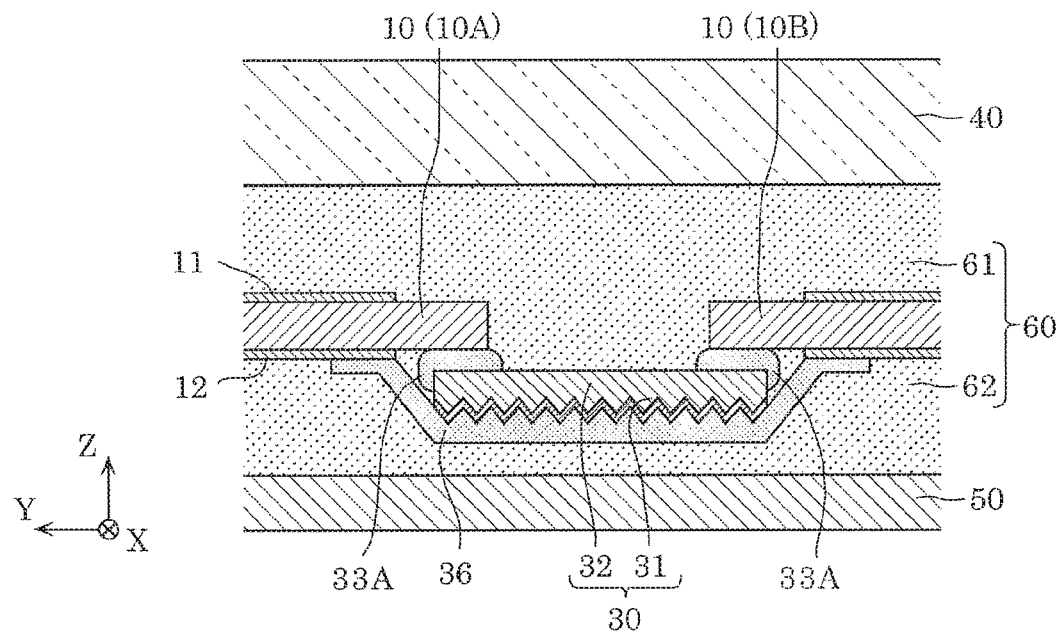
FIG. 19 is an enlarged cross-sectional view around a light reflector of a solar cell module according to Variation 2 of Embodiment 3.

FIG. 19 is an enlarged cross-sectional view around a light reflector of a solar cell module according to Variation 2 of Embodiment 3.

Adhesive member 33 according to Variation 1 of Embodiment 3 described above is disposed on the entire surface of insulating member 32, whereas adhesive member 33A according to this variation is disposed only between solar cell 10 and insulating member 32 as illustrated in FIG. 19.

Specifically, adhesive members 33A are disposed at two locations, namely between the back surface of first solar cell 10A and insulating member 32 and between the back surface of second solar cell 10B and insulating member 32, but are not disposed between first solar cell 10A and second solar cell 10B.

This allows light which enters light reflector 30 at right angles to directly fall on conductive light-reflective film 31, thus further improving the efficiency of power generation of solar cell module 1.

Note that although not illustrated, adhesive members 33B which are double-sided tapes may be used, instead of adhesive members 33A which are adhesives.

Embodiment 4

Figure 20:
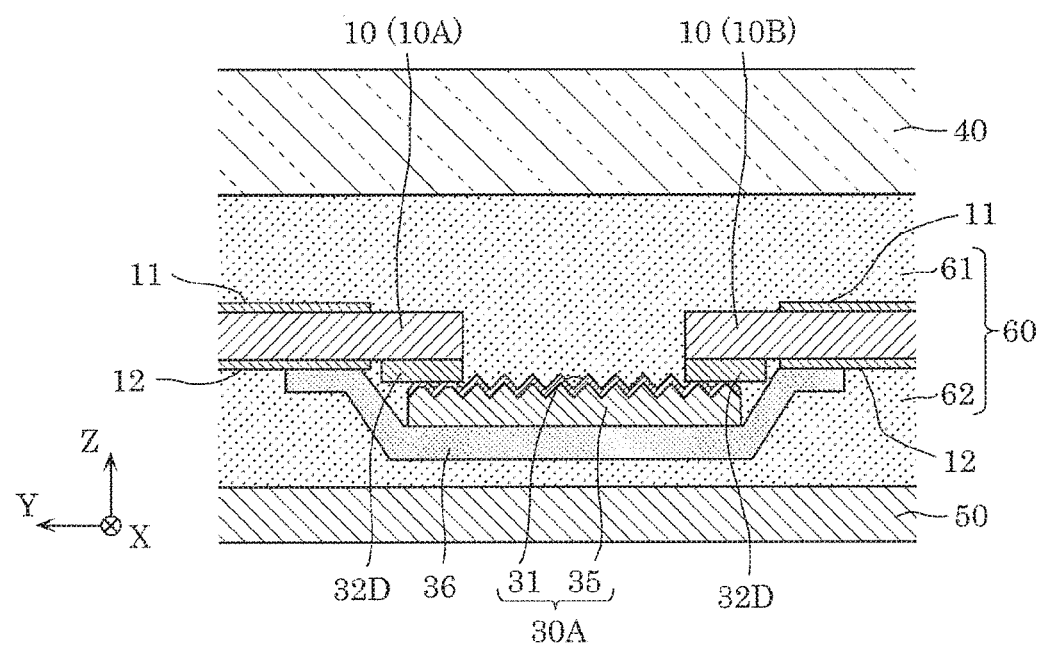
FIG. 20 is an enlarged cross-sectional view around a light reflector of a solar cell module according to Embodiment 4.

The following describes a solar cell module according to Embodiment 4 with reference to FIG. 20. FIG. 20 is an enlarged cross-sectional view around a light reflector of the solar cell module according to Embodiment 4.

As illustrated in FIG. 20, in the solar cell module according to the present embodiment, light reflector 30A includes conductive light-reflective film 31 and resin member 35, similarly to Embodiment 2. Specifically, light reflector 30A is disposed such that conductive light-reflective film 31 is oriented toward solar cells 10.

In addition, insulating member 32D is disposed between conductive light-reflective film 31 and the back surface of solar cell 10. Insulating member 32D is made of a material harder than the material of back-surface side encapsulant 62, similarly to insulating member 32 in Embodiment 1. Insulating member 32D may have adhesiveness, or may not have adhesiveness.

Insulating member 32D is disposed only between conductive light-reflective film 31 and solar cell 10. Specifically, insulating members 32D are disposed at two locations, namely between the back surface of first solar cell 10A and conductive light-reflective film 31 and between the back surface of second solar cell 10B and conductive light-reflective film 31, but are not disposed between first solar cell 10A and second solar cell 10B.

Note that single insulating member 32D may be disposed on the back surface side of first solar cell 10A and second solar cell 10B, extending across a space between first solar cell 10A and second solar cell 10B. In this case, a material having a refractive index higher than the refractive index of front-surface side encapsulant 61 may be used as the material of insulating member 32D.

Furthermore, light reflector 30A is fixed using adhesive tape 36 also in the present embodiment. Specifically, adhesive tape 36 is applied onto the back surface of first solar cell 10A and the back surface of second solar cell 10B, across conductive light-reflective film 31 and insulating members 32D.

As stated above, even the solar cell module according to the present embodiment yields the same advantageous effects as those achieved by Embodiment 1. For example, even in the present embodiment, insulating members 32D are made of a material harder than the material of back-surface side encapsulant 62, and thus insulating members 32D can be prevented from being squashed due to, for instance, the pressure applied during lamination processing so that conductive light-reflective film 31 and solar cells 10 do not come into contact with one another. Accordingly, the insulation between conductive light-reflective film 31 and solar cells 10 can be maintained.

In the present embodiment, resin member 35 is disposed on a surface of conductive light-reflective film 31 which is located on a side opposite insulating member 32D.

This prevents deterioration of conductive light-reflective film 31, and thus desired effects of improvement in efficiency of power generation achieved by disposing conductive light-reflective film 31 (light reflector 30A) can be maintained.

In the present embodiment, adhesive tape 36 fixes components between solar cells 10, covering light reflector 30A. This achieves the same advantageous effects as those achieved by Embodiment 3.

Other Variations Etc.

The above completes description of the solar cell modules according to the present disclosure based on Embodiments 1 to 4, yet the present disclosure is not limited to Embodiments 1 to 4 described above.

Figure 21A:
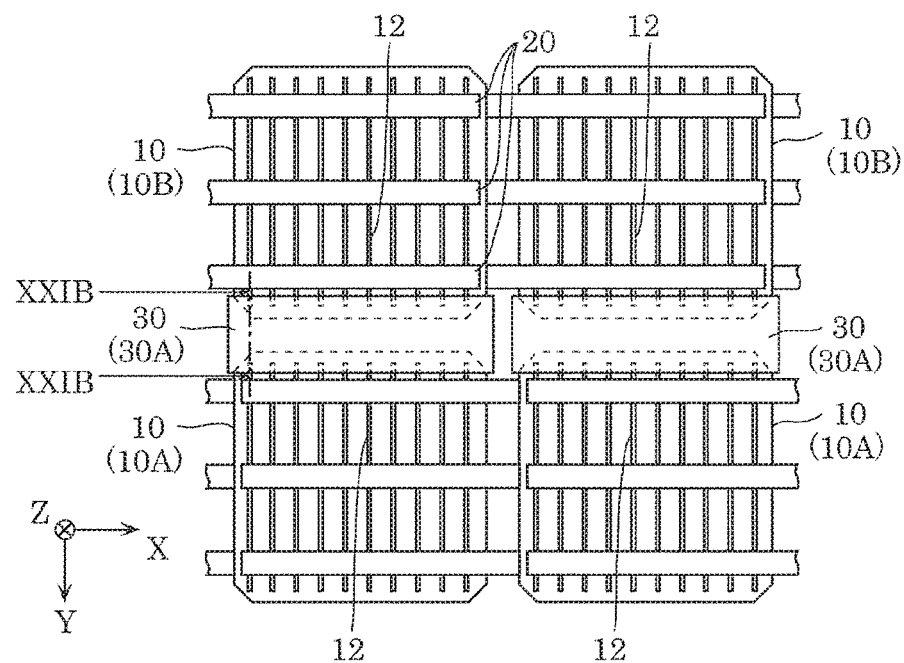
FIG. 21A is an enlarged plan view when a solar cell module according to Variation 1 is viewed from the back surface side.
Figure 21B:
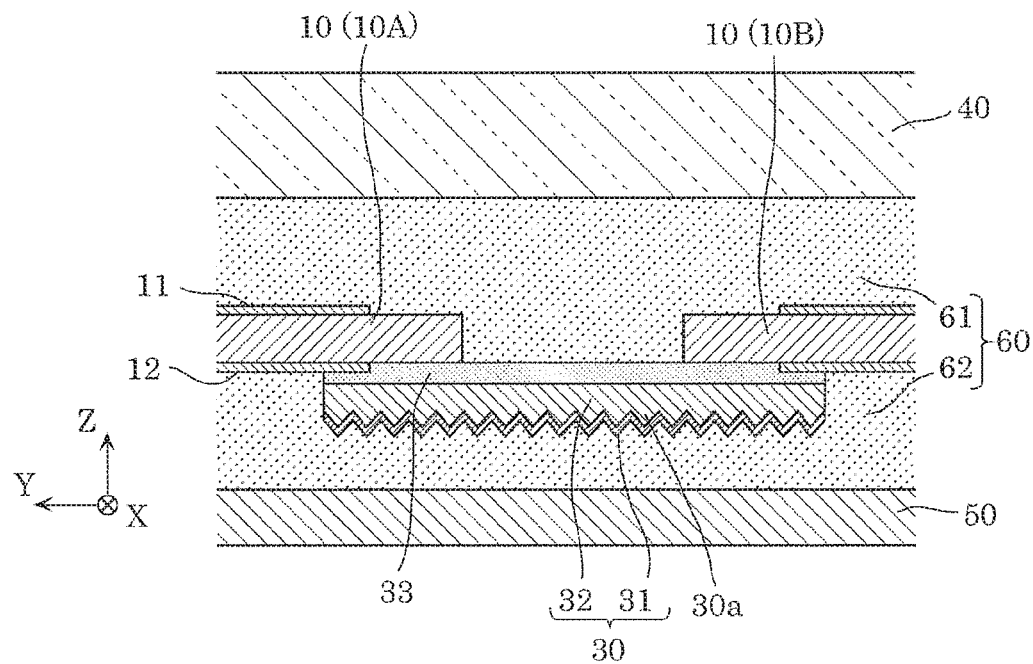
FIG. 21B is a cross-sectional view (enlarged cross-sectional view around the light reflector) of the solar cell module according to Variation 1 taken along line XXIB-XXIB in FIG. 21A.

For example, in the above embodiments, light reflectors 30 and 30A (conductive light-reflective film 31) are each disposed so as not to overlap back side collector electrode 12 of solar cell 10, yet the present disclosure is not limited to this. Specifically, as illustrated in FIGS. 21A and 21B, light reflector 30 (or 30A) may be disposed, overlapping an edge portion of back side collector electrode 12 of solar cell 10 (end portions of finger electrodes). FIG. 21A is an enlarged plan view when the solar cell module according to Variation 1 is viewed from the back surface side, and FIG. 21B is a cross-sectional view taken along line XXIB-XXIB in FIG. 21A.

As illustrated in FIGS. 21A and 21B, light reflector 30 (or 30A) is disposed on an edge portion of back side collector electrode 12, which improves adhesion between light reflector 30 (or 30A) and solar cell 10. Specifically, an anchoring effect achieved by the roughness (minute recesses and protrusions) of the surface of back side collector electrode 12 made of, for instance, silver allows light reflector 30 (or 30A) to be firmly bonded to back side collector electrode 12. As a result, the adhesion between light reflector 30 (or 30A) and solar cells 10 improves.

This prevents, during lamination processing, back-surface side encapsulant 62 from entering a region for forming front-surface side encapsulant 61 through a space between light reflector 30 (or 30A) and solar cells 10, and extending onto the light-receiving surface of solar cell 10, or conversely, prevents front-surface side encapsulant 61 from entering a region for forming back-surface side encapsulant 62 through a space between light reflector 30 (or 30A) and solar cells 10. Poor appearance due to a fall in adhesion between light reflector 30 (or 30A) and solar cell 10 can be prevented. In particular, in the case where front-surface side encapsulant 61 is made of a transparent material and back-surface side encapsulant 62 is made of a colored material, if back-surface side encapsulant 62 extends onto solar cell 10 and the front surface side, poor appearance will be conspicuous.

Note that even if light reflector 30 (or 30A) and an edge portion of back side collector electrode 12 do not overlap, equivalent effects can be obtained by giving a width of 1.5 mm or more to a region where light reflector 30 (or 30A) and solar cell 10 overlap. Specifically, a region in which light reflector 30 (or 30A) and solar cell 10 overlap is given a width of 1.5 mm or more, whereby the adhesion between light reflector 30 (or 30A) and solar cells 10 improves. Accordingly, front-surface side encapsulant 61 and/or back-surface side encapsulant 62 can be prevented from extending onto each other during the lamination processing, and also poor appearance can be avoided. In addition, light reflector 30 (or 30A) and an edge portion of back side collector electrode 12 overlap and furthermore, a region in which light reflector 30 (or 30A) and solar cell 10 overlap is given a width of 1.5 mm or more, whereby the adhesion between light reflector 30 (or 30A) and solar cell 10 can be significantly improved.

Figure 22:
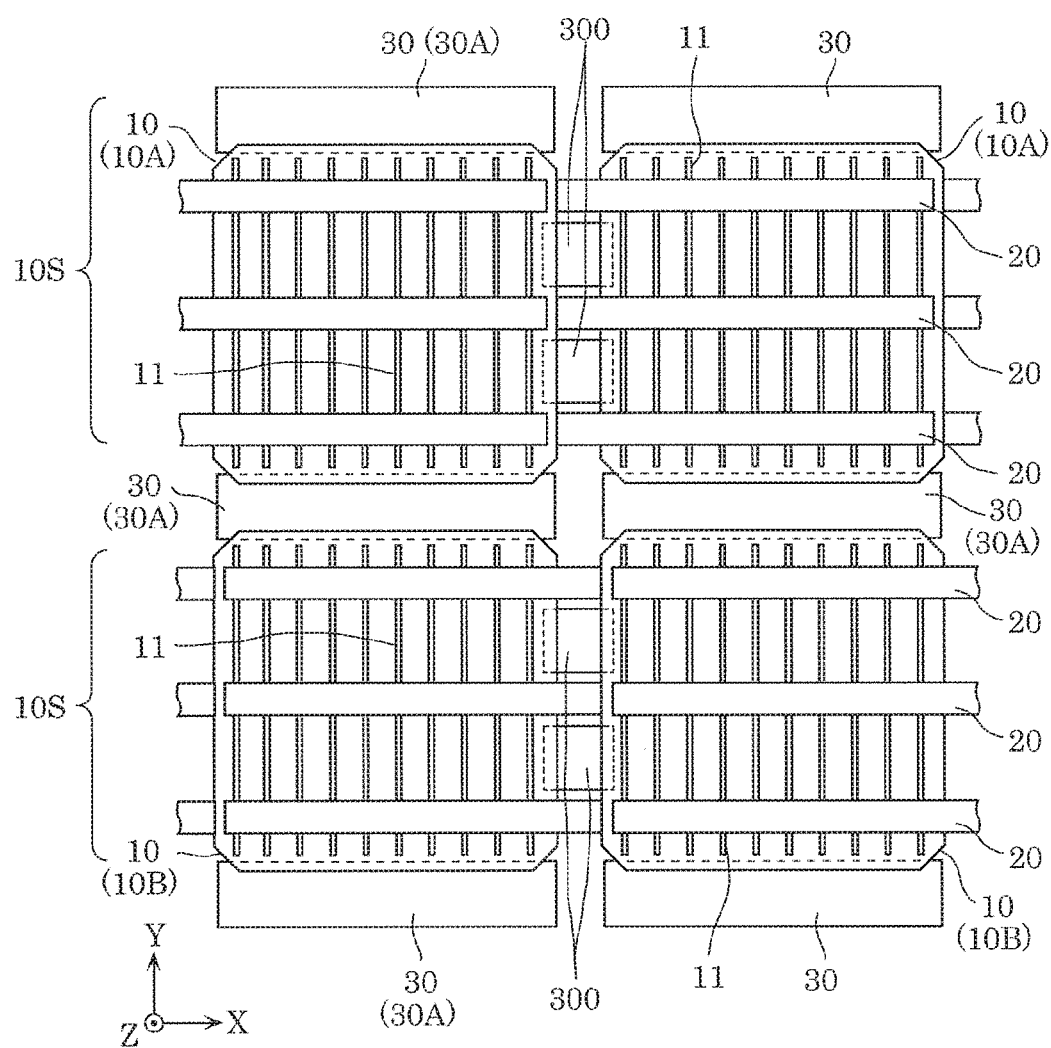
FIG. 22 is an enlarged plan view when a solar cell module according to Variation 2 is viewed from the front surface side.

In the above embodiments, light reflectors 30 and 30A are each disposed in a space between two adjacent strings 10S, yet the present disclosure is not limited to this. For example, light reflector 300 may be disposed in a space between solar cells 10 adjacent in string 10S, as illustrated in FIG. 22. Light reflector 300 has the same configuration as that of light reflector 30 or 30A, and can be bonded to solar cell 10 in the same disposition and shape as those of light reflector 30 or 30A.

Figure 23:
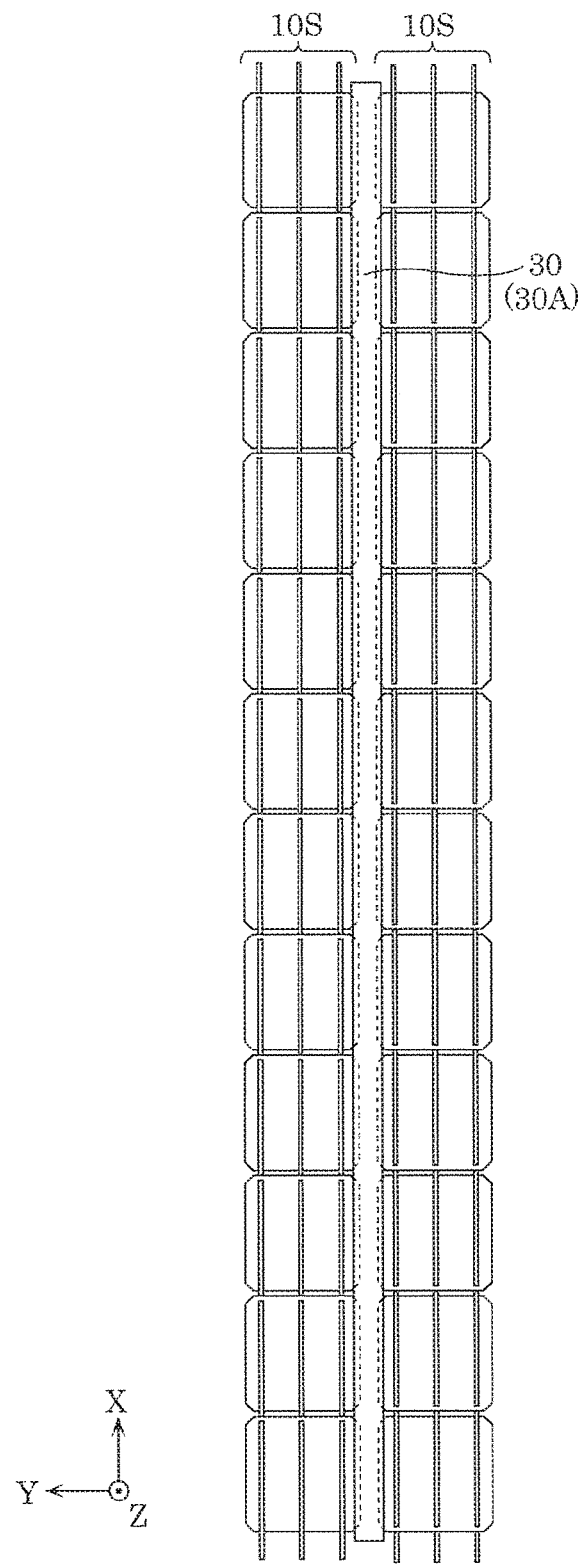
FIG. 23 is a partial enlarged plan view of a solar cell module according to Variation 3.
Figure 24:
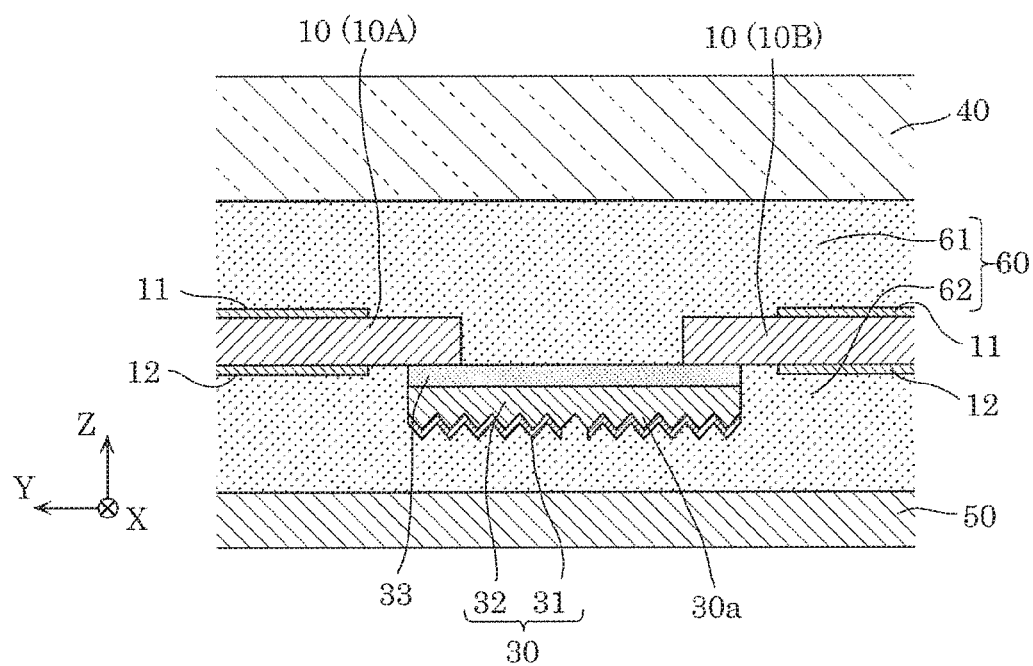
FIG. 24 is an enlarged cross-sectional view around a light reflector of a solar cell module according to Variation 4.
Figure 25:
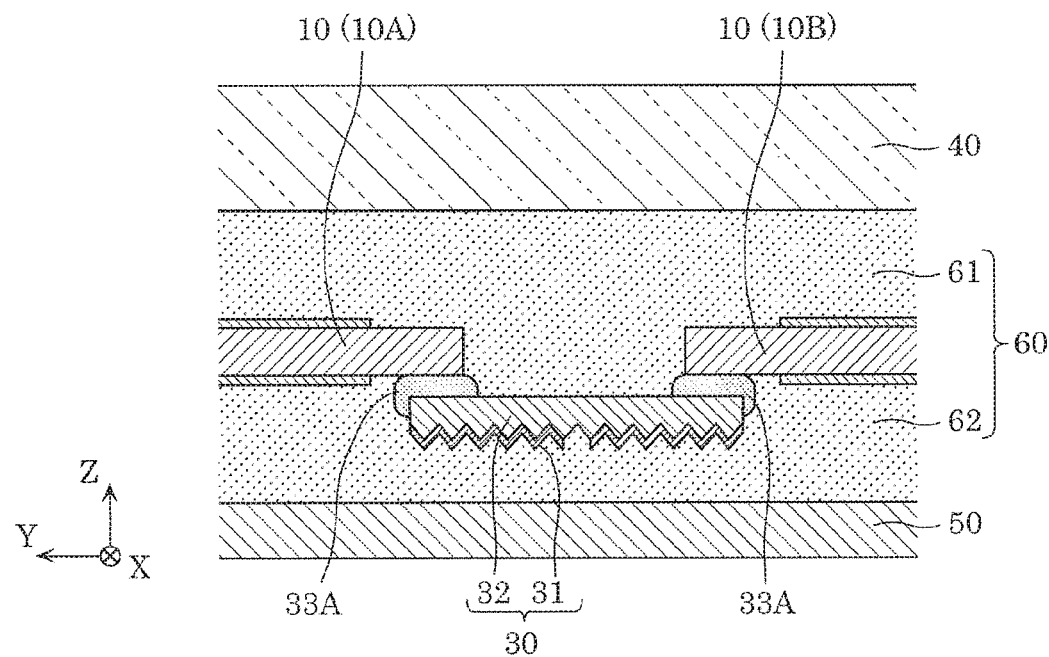
FIG. 25 is an enlarged cross-sectional view around the light reflector of the solar cell module according to a first aspect of Variation 4.
Figure 26:
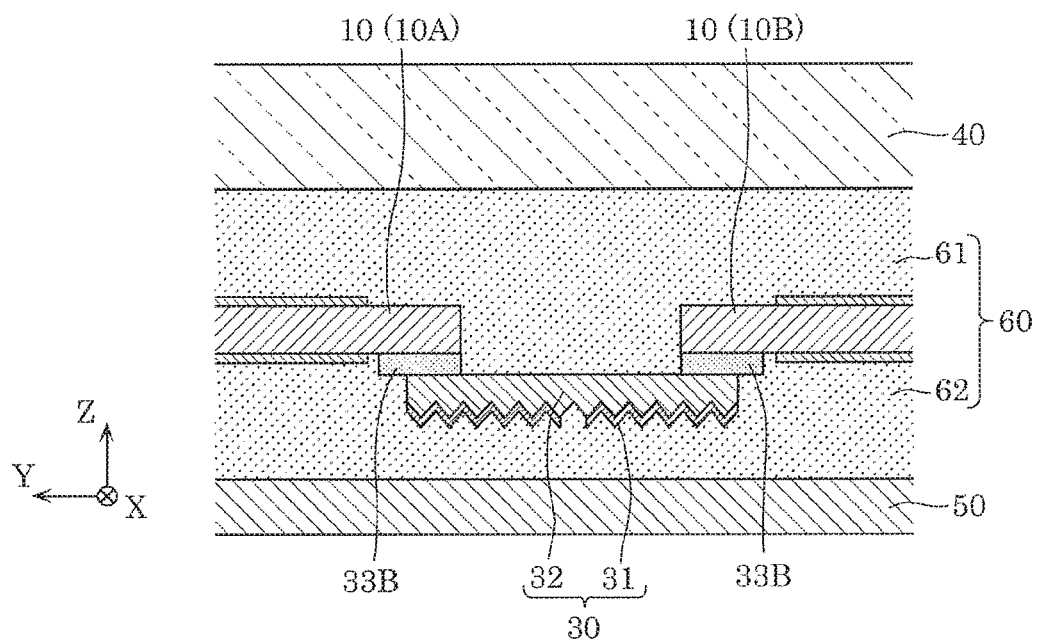
FIG. 26 is an enlarged cross-sectional view around the light reflector of the solar cell module according to a second aspect of Variation 4.
Figure 27:
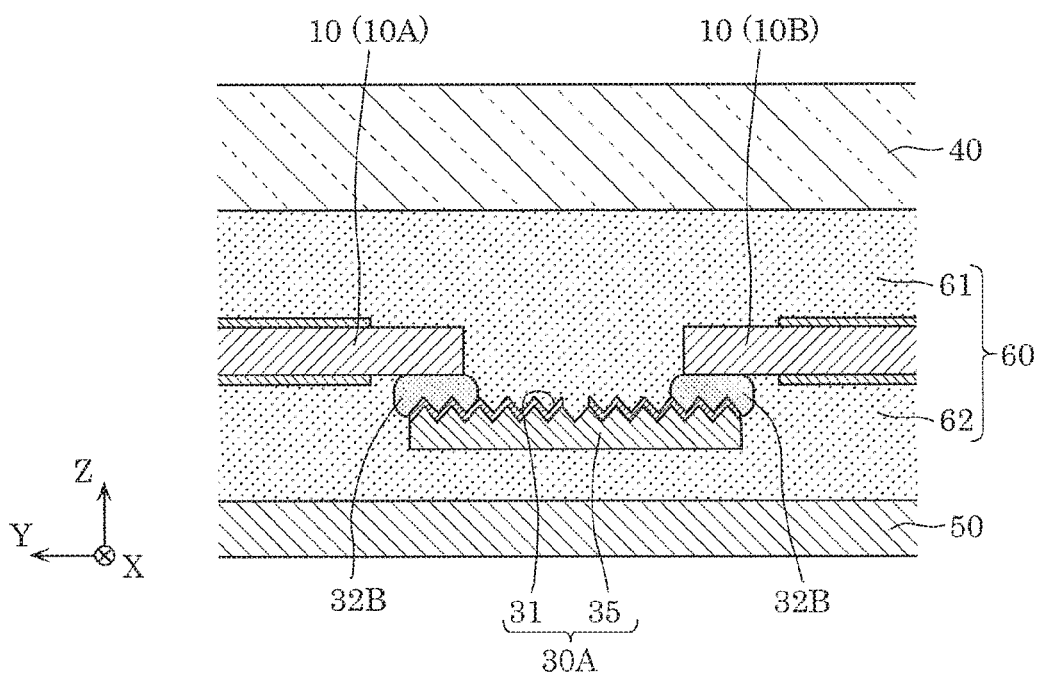
FIG. 27 is an enlarged cross-sectional view around the light reflector of the solar cell module according to a third aspect of Variation 4.
Figure 28:
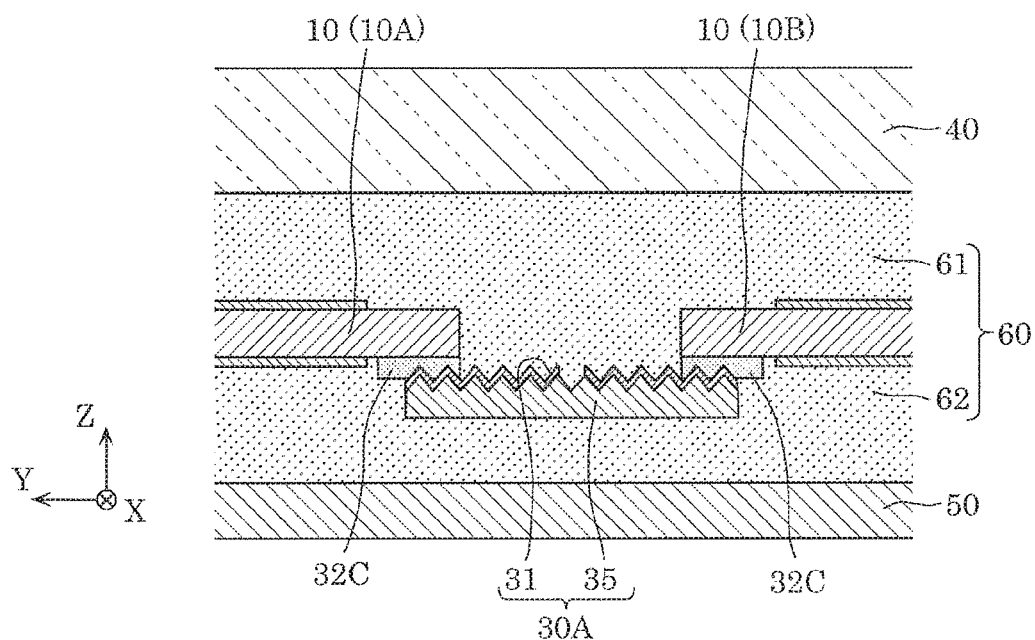
FIG. 28 is an enlarged cross-sectional view around the light reflector of the solar cell module according to a fourth aspect of Variation 4.

Furthermore, in the above embodiments, light reflectors 30 and 30A are disposed for each space between adjacent solar cells 10 included in a space between two adjacent strings 10S, yet the present disclosure is not limited to this. For example, each of light reflectors 30 and 30A may be disposed in a space between two adjacent strings 10S, extending along plural solar cells 10 and along the length of strings 10S. As an example, as illustrated in FIG. 23, light reflectors 30 and 30A may each be a single elongated light reflective sheet that extends along entire string 10S.

In the above embodiments, light reflectors 30 and 30A are disposed in all the spaces between strings 10S, but may be disposed in only some of the spaces. Stated differently, the spaces between solar cells may include a space in which light reflector 30/30A is not disposed.

In the above embodiments, conductive light-reflective film 31 is formed on entire surface of insulating member 32, yet the present disclosure is not limited to this. For example, as illustrated in FIGS. 24 to 28, a portion of conductive light-reflective film 31 between two adjacent solar cells 10 (first solar cell 10A and second solar cell 10B) may be severed. Accordingly, even if conductive light-reflective film 31 comes into contact with solar cell 10, leakage current is prevented from occurring between adjacent solar cells 10 via conductive light-reflective film 31.

Figure 29:
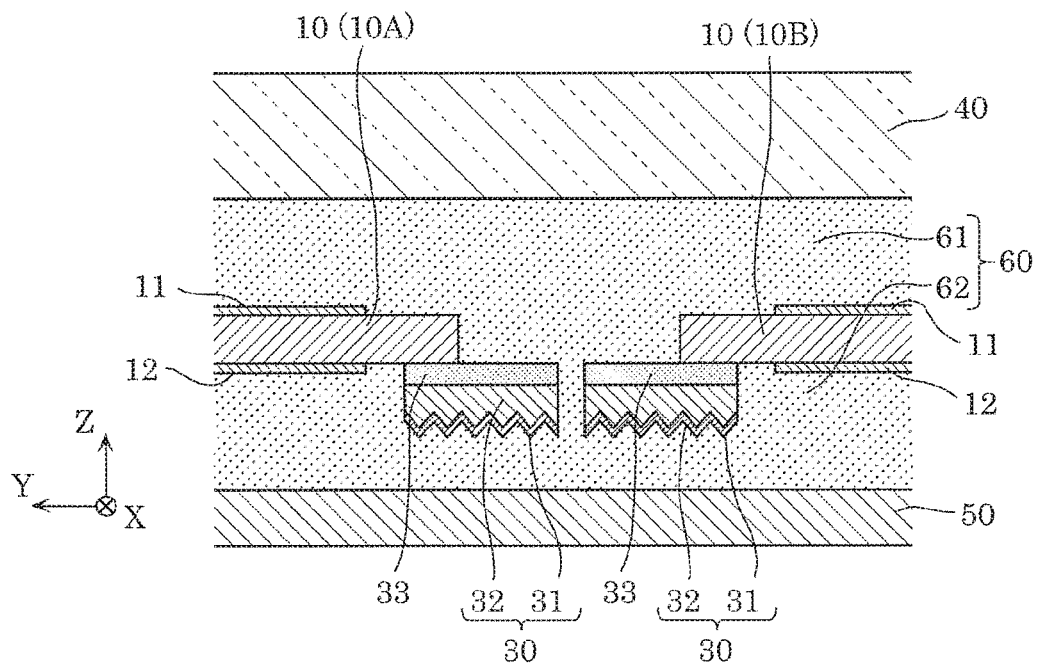
FIG. 29 is an enlarged cross-sectional view around the light reflector of the solar cell module according to an aspect of Variation 5.
Figure 30:
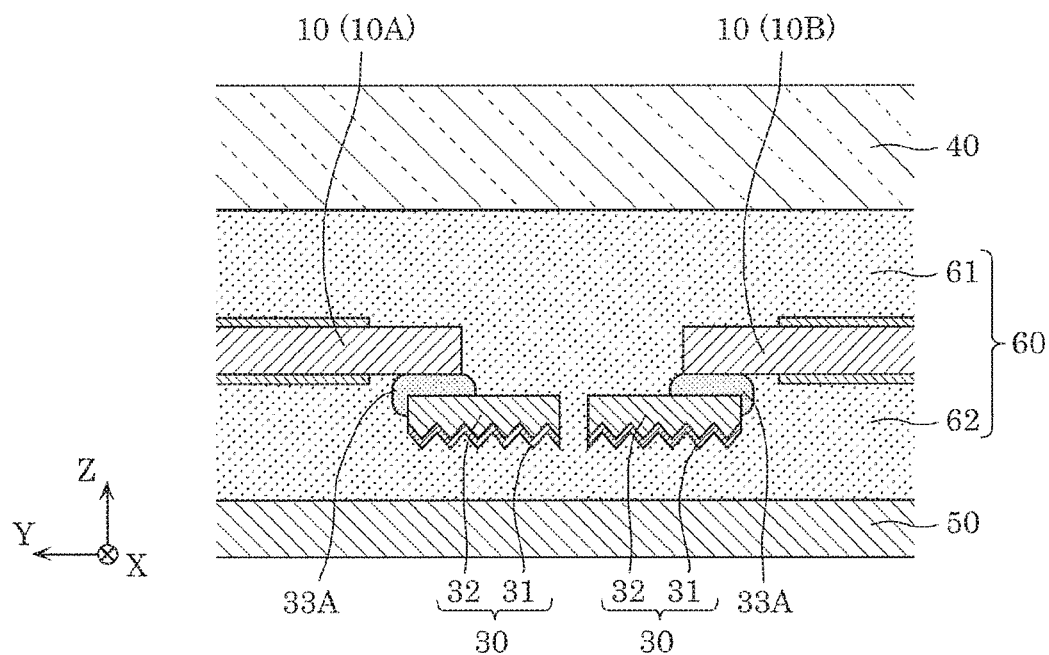
FIG. 30 is an enlarged cross-sectional view around the light reflector of the solar cell module according to a first aspect of Variation 5.
Figure 31:
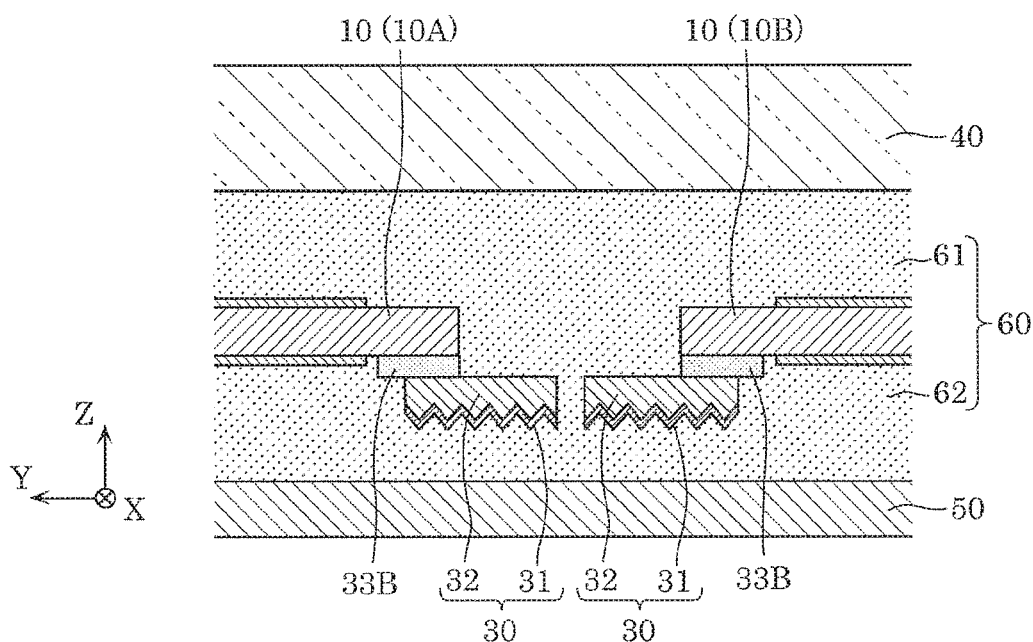
FIG. 31 is an enlarged cross-sectional view around the light reflector of the solar cell module according to a second aspect of Variation 5.
Figure 32:
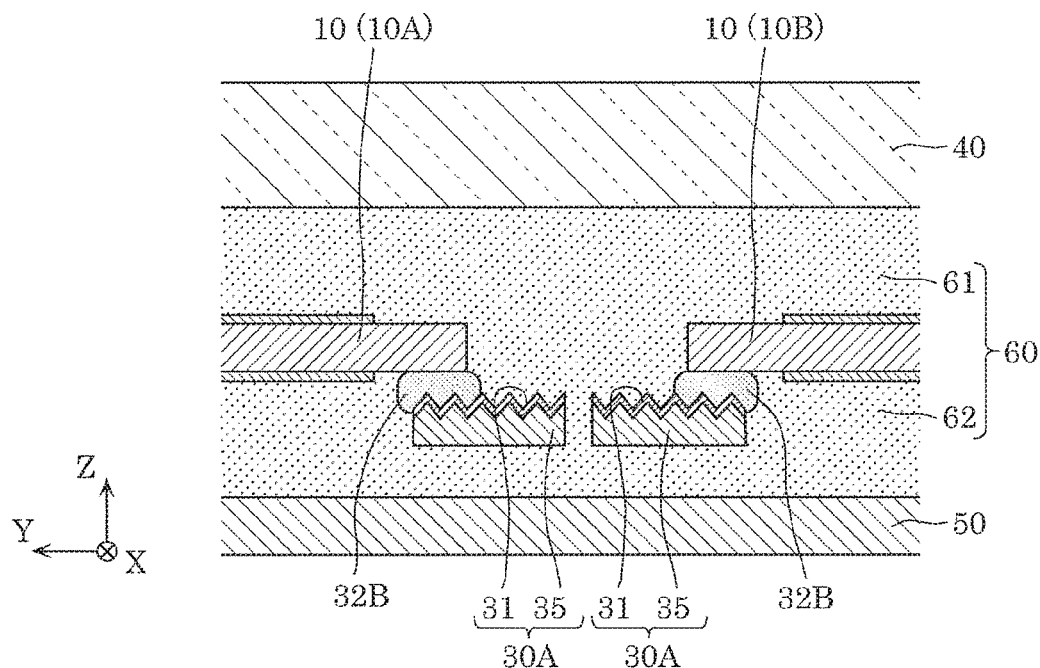
FIG. 32 is an enlarged cross-sectional view around the light reflector of the solar cell module according to a third aspect of Variation 5.
Figure 33:
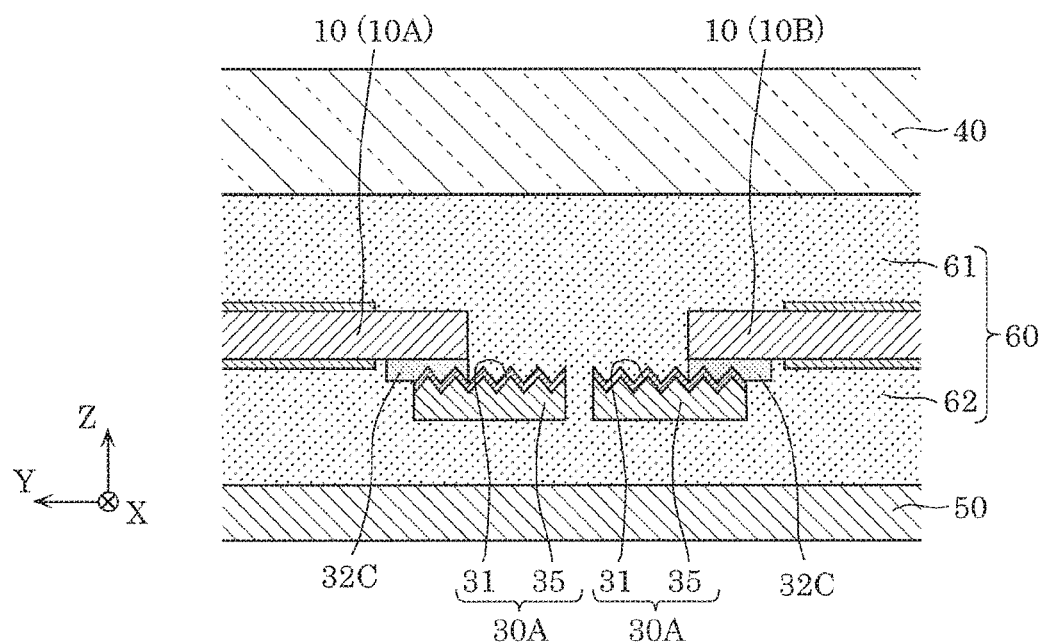
FIG. 33 is an enlarged cross-sectional view around the light reflector of the solar cell module according to a fourth aspect of Variation 5.

Furthermore, as illustrated in FIG. 29, not only conductive light-reflective film 31, but also a portion of insulating member 32 and a portion of adhesive member 33 may be severed. Also, as illustrated in FIGS. 30 to 33, not only conductive light-reflective film 31, but also a portion of insulating member 32 (or 35) may be severed. In FIGS. 29 to 33, insulating member 32 (or 35) is severed at the location of the severed portion of conductive light-reflective film 31. Stated differently, plural light reflectors 30 (or 30A) may be disposed side by side between two solar cells 10, rather than single light reflector 30 is disposed, extending across a space between two solar cells 10. For example, in FIG. 29, light reflectors 30 are disposed with a space therebetween, on edge portions of two solar cells 10, overlapping the space between solar cells 10.

Figure 34:
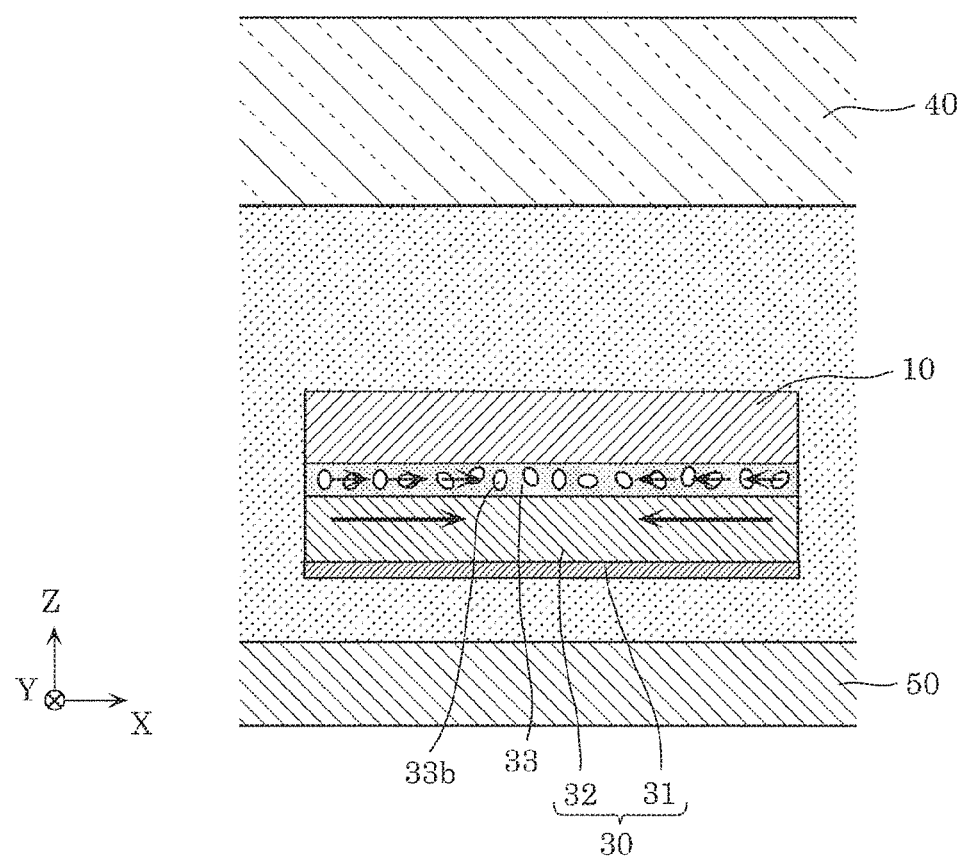
FIG. 34 is a partial enlarged cross-sectional view of a solar cell module according to Variation 6.

As illustrated in FIG. 34, adhesive member 33 may include plural voids 33b in the above embodiments. Voids 33b are, for example, air bubbles included in an air layer.

When light reflector 30 is bonded to solar cell 10 by thermocompression bonding, light reflector 30 may warp due to heat contraction of insulating member 32 which is a PET layer. Consequently, solar cell 10 may break, and desired reflective characteristics of light reflector 30 may not be achieved. Thus, stress caused by the heat contraction of insulating member 32 may be directly transferred to solar cell 10, and solar cell 10 may crack.

In view of this, adhesive member 33 serving as an adhesion layer for light reflector 30 and solar cell 10 may include plural voids 33b. This reduces stress caused by the heat contraction of insulating member 32. Specifically, as illustrated in FIG. 34, stress caused by the heat contraction of insulating member 32 is consumed to fill voids 33b, and thus stress transferred to solar cell 10 can be reduced. As a result, light reflector 30 can be prevented from warping. Accordingly, solar cell 10 can be prevented from cracking, and thus productivity and reliability of a solar cell module improve.

Note that voids 33b may be included in adhesive member 33 in advance, or may be introduced to adhesive member 33 when a solar cell module is manufactured.

In each of the above embodiments, although the semiconductor substrate of solar cell 10 is an n-type semiconductor substrate, the semiconductor substrate may be a p-type semiconductor substrate.

The solar cell module is a monofacial module in which only front surface protecting member 40 serves as a light-receiving surface in the above embodiments, but may be a bifacial module in which both front surface protecting member 40 and back surface protecting member 50 serve as light-receiving surfaces.

In the above embodiments, a semi-conducting material of a photoelectric converter of solar cell 10 is silicon, yet the present disclosure is not limited to this. Gallium arsenide (GaAs) or indium phosphide (InP) may be used as the semi-conducting material of the photoelectric converter of solar cell 10.

The present disclosure may also include embodiments as a result of various modifications that may be conceived by those skilled in the art, and embodiments obtained by combining elements and functions in the embodiments in any manner without departing from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   a first solar cell;
   a second solar cell adjacent to the first solar cell;
   a conductive light-reflective film spaced apart from a back surface of the first solar cell and a back surface of the second solar cell, the conductive light-reflective film overlapping an edge portion of the first solar cell and an edge portion of the second solar cell in a plan view;
   an insulating member disposed between the back surface of the first solar cell and the conductive light-reflective film, and between the back surface of the second solar cell and the conductive light-reflective film; and
   a back-surface side encapsulant covering the back surface of the first solar cell, the back surface of the second solar cell and the conductive light-reflective film, wherein:
   the first solar cell and the conductive light-reflective film are electrically isolated from each other,
   the second solar cell and the conductive light-reflective film are electrically isolated from each other,
   the insulating member comprises an insulating layer made of a resin material harder than a material of the back-surface side encapsulant,
   a first lengthwise edge portion of the conductive light-reflective film overlaps the first solar cell and is connected to the edge portion of the first solar cell, and a second lengthwise edge portion of the conductive light-reflective film overlaps with the second solar cell and is connected to the edge portion of the second solar cell,
   the conductive light-reflective film includes recesses and protrusions which are defined by protruding portions axisymmetric with respect to a thickness direction of the conductive light reflecting film, and the recesses and the protrusions overlap the edge portion of the first solar cell and the edge portion of the second solar cell,
   the insulating member includes a first surface and a second surface on a side opposite the first surface, the second surface facing the first solar cell,
   recesses and protrusions are formed in the first surface,
   recesses and protrusions are not formed in the second surface,
   the conductive light-reflective film is formed on the first surface of the insulating member, the insulating member serving as a base material,
   an adhesive layer is further disposed between the second surface of the insulating member and the first solar cell and between the second surface of the insulating member and the second solar cell, and bonding the insulating member to the first solar cell and the second solar cell,
   the solar cell module further comprises an intermediate member disposed between the second surface of the insulating member and the first solar cell,
   the adhesive layer is disposed between the second surface of the insulating member and the intermediate member, and
   the intermediate member has a refractive index lower than the refractive index of the insulating layer and higher than the refractive index of a front-surface side encapsulant covering a front surface of the first solar cell.

2. The solar cell module according to claim 1, wherein the adhesive layer is made of a material softer than the resin material of the insulating layer.

3. The solar cell module according to claim 1, wherein the insulating layer is made of a transparent material.

4. The solar cell module according to claim 1, wherein:
   the conductive light-reflective film is a metal film, and
   the back-surface side encapsulant is made of a white material.

5. The solar cell module according to claim 3, wherein the insulating layer has a refractive index higher than a refractive index of the front-surface side encapsulant.

6. The solar cell module according to claim 1, further comprising:
   an adhesive tape applied to the back surface of the first solar cell and the back surface of the second solar cell, to cover the conductive light-reflective film.

7. The solar cell module according to claim 1, wherein a portion of the conductive light-reflective film between the first solar cell and the second solar cell is severed.

8. The solar cell module according to claim 7, wherein a portion of the insulating layer is severed at a location of the severed portion of the conductive light-reflective film.

9. The solar cell module according to claim 1, wherein:
   the conductive light-reflective film has a repeating structure of protruding portions and recessed portions, and
   at least one of the protruding portions in a portion of the conductive light-reflective film that overlaps the first solar cell via the insulating layer has a flat surface.

10. The solar cell module according to claim 1, wherein
the conductive light-reflective film has a repeating structure of protruding portions and recessed portions, and
at least one of the protruding portions in a portion of the conductive light-reflective film that overlaps the first solar cell via the insulating layer is partially removed.

11. The solar cell module according to claim 1, wherein the adhesive layer includes voids.

12. The solar cell module according to claim 1, wherein the conductive light-reflective film has a repeating structure of protruding portions and recessed portions.

13. The solar cell module according to claim 1, further comprising a back surface protecting member disposed to be in contact with the back surface side encapsulant.

* * * * *